US012389550B1

(12) United States Patent
Pulugurtha et al.

(10) Patent No.: US 12,389,550 B1
(45) Date of Patent: Aug. 12, 2025

(54) INLINE MONITORING SYSTEM FOR PROCESS DEFECTS DURING MANUFACTURING

(71) Applicants: Markondeyaraj Pulugurtha, Miami, FL (US); Satheesh Bojja Venkatakrishnan, Miami, FL (US); John Volakis, Miami, FL (US); Peeyush Awasthi, Miami, FL (US); Anthony Giordano, Miami, FL (US)

(72) Inventors: Markondeyaraj Pulugurtha, Miami, FL (US); Satheesh Bojja Venkatakrishnan, Miami, FL (US); John Volakis, Miami, FL (US); Peeyush Awasthi, Miami, FL (US); Anthony Giordano, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 19/054,117

(22) Filed: Feb. 14, 2025

(51) Int. Cl.
*H05K 3/22* (2006.01)
*H01Q 15/02* (2006.01)

(52) U.S. Cl.
CPC ............ *H05K 3/225* (2013.01); *H01Q 15/02* (2013.01); *H05K 2203/107* (2013.01); *H05K 2203/163* (2013.01)

(58) Field of Classification Search
CPC ............. H05K 3/225; H05K 2203/107; H05K 2203/163; H01Q 15/02
See application file for complete search history.

(56) References Cited

U.S. PATENT DOCUMENTS

| | | | |
|---|---|---|---|
| 12,339,316 B2 * | 6/2025 | Carluccio | G01R 31/2896 |
| 12,341,492 B2 * | 6/2025 | Yang | H03H 9/568 |
| 2006/0125475 A1 * | 6/2006 | Sodickson | A61B 5/0536 600/416 |
| 2009/0072845 A1 * | 3/2009 | McCoy | G01R 31/2801 324/757.02 |
| 2020/0207618 A1 * | 7/2020 | Liu | G01R 27/2605 |
| 2024/0063136 A1 * | 2/2024 | Niazi | H01L 23/544 |
| 2025/0149794 A1 * | 5/2025 | Liu | H01Q 21/064 |
| 2025/0180628 A1 * | 6/2025 | Mosavirik | G01R 27/08 |

* cited by examiner

Primary Examiner — Nha T Nguyen
(74) Attorney, Agent, or Firm — SALIWANCHIK, LLOYD & EISENSCHENK

(57) ABSTRACT

Systems and methods are provided for inline process monitoring (e.g., remote inline process monitoring) for scalable and precision high-yield manufacturing. Antenna probes, such as millimeter (mm) wave (mmWave) antenna (mWA) probes, can be introduced into fabrication equipment to reveal the nature of hidden conductor and/or dielectric defects, as well as via-pad and/or device pad-trace misalignments, going beyond automated optical inspection (AOI) or contact probing.

20 Claims, 28 Drawing Sheets

| PCB (Monitored) | S11 (min) | S11(Phase Change) Range/Interval (I) | S12 (max) | S12(Phase Change) Range/Interval |
|---|---|---|---|---|
| STD Ring (No Break) Case -a | 94.05275 GHz | 92.985 GHz – 95.284 GHz (I-2.298 GHz) | 93.94939 GHz | 87.560 GHz – 101.971 GHz (I- 14.411 GHz) |
| Break Inner Ring (20 um) Case -c | 93.9414 GHz | 92.596 GHz-95.206 GHz (I-2.610 GHz) | 93.82701 GHz | 88.104 GHz – 102.389 GHz (I-14.286 GHz) |
| Break Outer Ring (20 um) Case -b | 93.95267 GHz | 92.807 GHz – 95.109 GHz (I-2.302 GHz) | 93.84893 GHz | 87.516 GHz—101.942 GHz (I-14.426 GHz) |
| Break in Both Ring Case -d | 94.03006 GHz | 92.751 GHz – 95.317 GHz (I-2.566 GHz) | 93.87376 GHZ | 88.118 GHz – 102.360 GHz (I-14.242 GHz) |

FIG. 17

| Freq [GHz] | Std GAP by case (i) dB(S(1,1)) | Tripple Gap by case (ii) dB(S(1,1)) | Tripple Gap by case (iii) dB(S(1,1)) | Double Gap by case (iv) dB(S(1,1)) | **Resonating Frequency response in RED |
|---|---|---|---|---|---|
| 71.75 | -23.9097 | -25.2303 | -27.9331 | -31.6159 | |
| | | | | | |
| 71.75 | -23.9097 | -25.2303 | -27.9331 | -31.6159 | |
| | | | | | |
| 71.75 | -23.9097 | -25.2303 | -27.9331 | -31.6159 | |
| | | | | | |
| 71.75 | -23.9097 | -25.2303 | -27.9331 | -31.6159 | |

FIG. 18

| Freq [GHz] | Std Ring GAP by case (i) dB(S(2,1)) | Triple Ring Gap by case (ii) dB(S(2,1)) | Triple Ring Gap by case (iii) dB(S(2,1)) | Double Ring Gap by case (iv) dB(S(2,1)) | GAP |
|---|---|---|---|---|---|
| 149.6 GHz | -91.1247 | -86.1456 | -77.3364 | -74.6142 | STD/Baseline |
| 149.15 GHz | -78.4397 | -93.6045 | -82.0253 | -73.7925 | Tripple |
| 149.15 GHz | -78.4397 | -93.6045 | -82.0253 | -73.7925 | Tripple |
| 122.6 GHz | -65.4127 | -59.2228 | -61.8566 | -88.9474 | Double |

FIG. 19

INLINE MONITORING SYSTEM FOR PROCESS DEFECTS DURING MANUFACTURING

GOVERNMENT SUPPORT

This invention was made with government support under 1809728 awarded by the National Science Foundation. The government has certain rights in the invention.

BACKGROUND

In order to meet future substrate roadmap targets, manufacturers need smart production tools that can achieve the required process tolerance, throughput, and yield at lower costs to maintain competitive prices. There is also an environmental impact to be considered when producing substrates and parts to go on the substrate.

BRIEF SUMMARY

In view of the above, there is a need in the art to reduce the environmental impact through additive manufacturing advances, while still attaining high integration density. Embodiments of the subject invention provide novel and advantageous systems and methods for inline process monitoring (e.g., remote inline process monitoring) for scalable and precision high-yield manufacturing. Antenna probes, such as millimeter (mm) wave (mmWave) antenna (mWA) probes, can be introduced into fabrication equipment to reveal the nature of hidden conductor and/or dielectric defects, as well as via-pad and/or device pad-trace misalignments, going beyond automated optical inspection (AOI) or contact probing that is used in the related art.

In an embodiment, a system for inline monitoring of a manufacturing process can comprise: a first antenna sensor disposed on a first side of a substrate of an electronic device being manufactured during the manufacturing process, the first antenna sensor being configured to operate as a transmitter (and/or a receiver); optionally a second antenna sensor disposed on a second side of the substrate opposite the first side of the substrate, the second antenna sensor being configured to operate as a receiver; a processor; and a machine-readable medium in operable communication with the processor. The first antenna and the second antenna (if present) can be configured to generate a dataset of S-parameter data from the substrate and to transmit the dataset to the machine-readable medium. The machine-readable medium can have instructions stored thereon that, when executed by the processor, perform the following steps: receive the dataset from the first antenna and/or the second antenna; analyze the dataset to identify a defect in the substrate by comparing the dataset to reference data; and provide process corrections to a user of the system to address the identified defect in the substrate. The system can include equipment for implementing the process corrections. The first antenna sensor can be an mWA, and the second antenna sensor can be an mWA. The system can further comprise at least one defect monitoring structure formed on the substrate. The defects for which the at least one defect monitoring structure monitors can include, for example, fabrication errors, shifts in features, misalignment between features, and delamination between features (among others). The at least one defect monitoring structure can comprise a ring resonator, such as a ring a ring resonator with multiple resonance-using grooves. The first antenna sensor and the second antenna sensor can each have a dual patch topology, a patch topology, a horn topology, a spiral topology, and/or a Yagi topology. The first antenna sensor can comprise a first antenna array (e.g., for improved gain), and/or the second antenna sensor can comprise a second antenna array (e.g., for improved gain) The substrate can comprise at least one via structure and at least one pad structure. The first antenna sensor (e.g., transmitting antenna sensor) can be coupled with a first lens (e.g., a Fresnel lens or a curved lens for improved sensitivity) configured to reduce a first aperture and narrow a first bandwidth, and/or the second antenna sensor (e.g., receiving antenna sensor) can be coupled with a second lens (e.g., a Fresnel lens or a curved lens for improved sensitivity) configured to reduce a second aperture and narrow a second bandwidth. The analyzing of the dataset to identify a defect in the substrate can comprise using a machine learning (and/or artificial intelligence) model to analyze the dataset. The machine learning model can be trained using the reference data. The defect can comprise at least one of a line discontinuity, a line width change, a die pad shift, a radio frequency (RF) circuit pattern shift, an interconnect pad shift, and a via-pad shift of at least 5 microns. The first antenna can have first grooves configured for multiple resonances, and/or the second antenna can have second grooves configured for multiple resonances.

In another embodiment, a method for inline monitoring of a manufacturing process can comprise: providing a system having any or all of the features described in the previous paragraph (and/or elsewhere in this document); using the first antenna sensor and the second antenna sensor to generate the dataset of S-parameter data from the substrate; transmitting the dataset from the first antenna sensor and the second antenna sensor to the machine-readable medium; analyzing the dataset to identify the defect in the substrate by comparing the dataset to reference data; and providing process corrections to the user of the system to address the identified defect in the substrate. The method can further comprise implementing the process corrections to address the identified defect in the substrate (correction(s) can include pad size adjustment, line width adjustment, line spacing adjustment, and/or others). The process corrections can comprise, for example: adding printed metal or dielectric material; and/or trimming metal or a dielectric pattern with a laser.

BRIEF DESCRIPTION OF DRAWINGS

FIG. 17 shows a table of IMS sensitivity to discontinuity for 20 micrometers (μm) in either or both rings for S11 and S12 parameters.

FIG. 18 shows a table of S11 response (amplitude shift) for changes of "gap" between traces/tracks of inner and outer rings.

FIG. 19 shows a table of S21 response for the gap changes between the rings by 2-3×.

DETAILED DESCRIPTION

Figure 1:
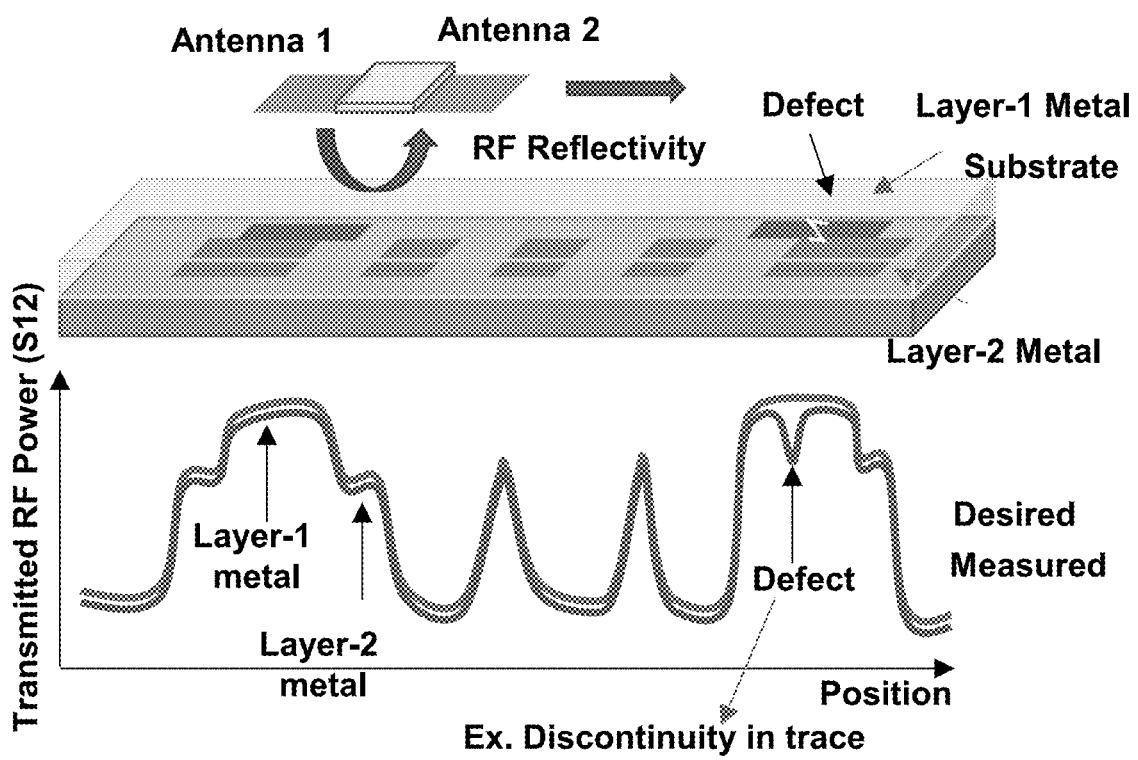
FIG. 1 shows a schematic view of an antenna sensor to detect process variation, according to an embodiment of the subject invention (middle section of FIG. 1). The upper section shows antennas, and the bottom section shows a plot of transformed radio frequency (RF) power versus position.

Embodiments of the subject invention provide novel and advantageous systems and methods for inline process monitoring (e.g., remote inline process monitoring) for scalable and precision high-yield manufacturing. Antenna probes, such as millimeter (mm) wave (mmWave) antenna (mWA) probes, can be introduced into fabrication equipment to reveal the nature of hidden conductor and/or dielectric defects, as well as via-pad and/or device pad-trace misalignments, going beyond automated optical inspection (AOI) or contact probing that is used in the related art.

Achieving inline process control to provide early detection of drifts to avoid yield loss and meet the future manufacturing tolerances can address the need to reduce the environmental impact through additive manufacturing advances, while still attaining high integration density. Continuous feedback is important to establish automatic correction protocols. Indeed, as the industry establishes a pathway for additive manufacturing, these protocols can become more critical. This is particularly true for additively manufactured electronics, where line dimensions and spaces are affected by minor process and material shifts. There is a need in the art for smart fabrication with real-time process monitoring (e.g., augmented by deep learning artificial intelligence (AI) technology) that enables real-time process control.

The probes (e.g., mWA array probes), which can be referred to herein as sensors (e.g., mWA array sensors), can detect substrate process defects through the changes in the radio frequency (RF) reflection (e.g., S11). These sensors can also reveal information by measuring radar cross section (RCS) changes from the in-built process control monitoring (PCM) structures in the fabricated substrate through variation in the scattering parameters (S12). One or more embedded machine learning (ML) algorithms can then be used to properly classify the S11 resonant frequency shift or S12 amplitude variation across the substrate and relate them to line-width, spacing, dielectric thickness, bridging, misalignment, and/or other process defects. This monitoring and feedback process can correct the tool and process conditions and therefore achieve scalable and high-yield manufacturing of high-density multilayered three-dimensional (3D) substrates.

Embodiments provide noncontact, real-time detection of hidden manufacturing defects to achieve inline process control for reproducibility, high tolerance, and yield, eventually leading to high-density electronics integration. This can be achieved through an innovative mmWave sensing system that can reveal the hidden metal-dielectric features through backscattering. The frequency and amplitude shifts from the backscattered spectra can be classified into defect categories through ML algorithms and provide real-time corrective actions. The corrective actions can be very important and can include: 1) printed metal trace extensions for thickness or line width to correct for the impedance; and/or 2) laser-trimmed trace to correct for the impedance.

Compared to related art systems and methods, embodiments of the subject invention can utilize noncontact and wireless real-time inline mmWave passive probing, which can be integrated with a tool head to detect both surface and hidden material, geometry, and/or structural defects (as compiled in the table shown in FIG. 17).

Existing contact-based electrical probing approaches characterize line continuity and geometric control but usually slow the production throughput and also create constraints associated with damage to the contact probes. Therefore, in printed circuit board (PCB)-scale manufacturing, automated optical inspection is preferred for inline monitoring of high-density multilayered substrates. Usually, separate test structures can be incorporated for the process monitoring. Major electronics manufacturers such as Intel utilize AOI in combination with sophisticated AI-powered image analysis software to detect foreign objects, bridging between circuits, and other process defects and increase its sensitivity. However, this is performed one layer at a time during fabrication, at the end of each process step, and is often complemented with destructive techniques such as cross-sectioning to get the detailed information. Non-contact techniques such as profilometry, optical scatterometry, and Shadow-Moire imaging for thermomechanical interaction that results in warpage are also widely used. Atomic force microscopy (AFM) can also be used to integrate nanoscale metrology systems for inline wafer monitoring during semiconductor fabrication.

Embodiments of the subject invention can incorporate continuous feedback in process tools so that in situ adjustments can be made to enable future smart manufacturing. Sensors (e.g., antenna sensors such as mWA sensors) can be developed and integrated into manufacturing equipment to reveal the nature of hidden conductor defects, dielectric defects, via-pad misalignments, and/or device pad-trace misalignments. The sensors can be integrated with 3D printing equipment to demonstrate compatibility with production-scale equipment. Enhanced ML algorithms can be used to classify sensor signals from defects and relate them to line-width, spacing, dielectric thickness, bridging, misalignment, and/or other process defects. Techniques can be used to directly detect design hot spots through the sensor (e.g., antenna sensor such as mWA sensor) technique.

In many embodiments, inline non-contact wireless process monitoring can be performed, and at least one of the following can be used: 1) an mWA array probe for inline monitoring of substrates; and 2) substrate PCM structures that are based on similar design rules as substrates so that process defects are easily identified. These structures can be designed with small footprints that are easy to integrate and implement in a real production sample. The reflected power can be compared to reference patterns for defect identification using algorithms that are built into the tool. The key enabler is the high-Q antenna probes that work at mmWave frequencies. The reflected signal power (S21) and resonant frequency deviation (S11) of the antenna probe due to capacitive and inductive loading can provide sufficient distinction in identifying defects using remote wireless process sensing and monitoring. The substrate PCM structures can be designed to generate the reflected RF signal power from the mWA array probes. By employing mmWave sensing, increased resolution (e.g., approaching less than 100 micrometers (μm), such as less than 10 μm) can be achieved.

Embodiments can rely on high-sensitivity and low-power mWA sensor arrays. Passive mmWave arrays are versatile and can be used for stand-off probing of embedded metal layers and their imperfections. During substrate fabrication, mWA probes can monitor 3D printing accuracy in real-time. A key challenge is to increase the sensitivity of the antenna to the type of defects. The parameters to be monitored can include conductor line width, spacing, dielectric thickness, and/or material conductivity defects. Another key challenge in designing passive mmWave antenna systems (e.g., at 94 gigahertz (GHz)), is the matching and efficiency of the receiving array. Often, a designer resorts to low noise amplifiers (LNAs) and active power supplies to increases sensitivity. Embodiments can use a design that does not require LNAs, and it can be completely passive and rely on a novel ElectroOptic modulator (EOM) embedded within the antenna feed. This integration of RF and optics avoids associated practical issues such as Ohmic losses, interconnect parasitic losses, and mismatch issues. It can also overcome issues with material dispersion relating to the bandwidth-sensitivity product.

Figure 9:
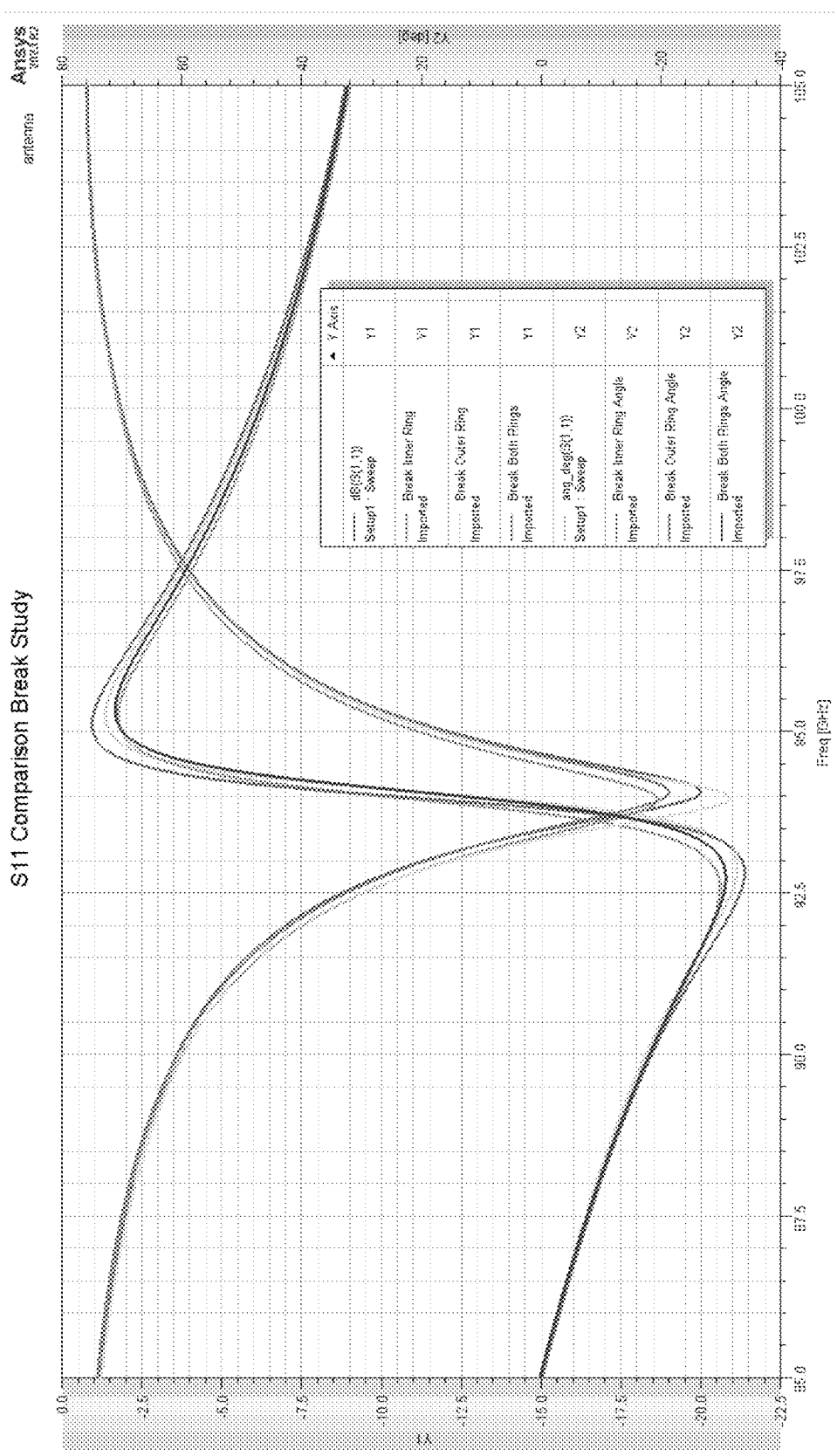
FIG. 9 shows a plot of the S11 and corresponding phase shifts with 20 mm discontinuity in either or both rings.

In one embodiment, an ultra-low-profile bow-tic dipole antenna operating in mmWave regime can be used. To address accuracy in the extraction, resolution can be improved by developing larger mmWave arrays. Doing so, beam collimation can be exploited to narrow the radiation beams, and, thus, resolution. The key benefits of these antennas are: 1) readily integrated into standard microfabrication processes; and 2) strong field enhancement within the antenna feed slot. FIG. 9 shows a plot for an optimized 94 GHz antenna with an impressive field of 1000-fold enhancement (30 decibels (dB)) using 350 μm long extended bars at the feed. FIG. 9 also shows the antenna radiation pattern with excellent spatial coverage. The system can also utilize waveguide-fed mWAs for benchtop testing to accelerate the design iterations through short-loop testing, as illustrated in the previous work (see also, Carvalho et al., "Grounded Coplanar Waveguide-Fed Millimeter Wave Volumetric Pyramidal Horn on LTCC," in 2019 IEEE International Symposium on Antennas and Propagation and USNC-URSI Radio Science Meeting, 2019, pp. 1885-1886; which is hereby incorporated herein by reference in its entirety).

Figure 16A:
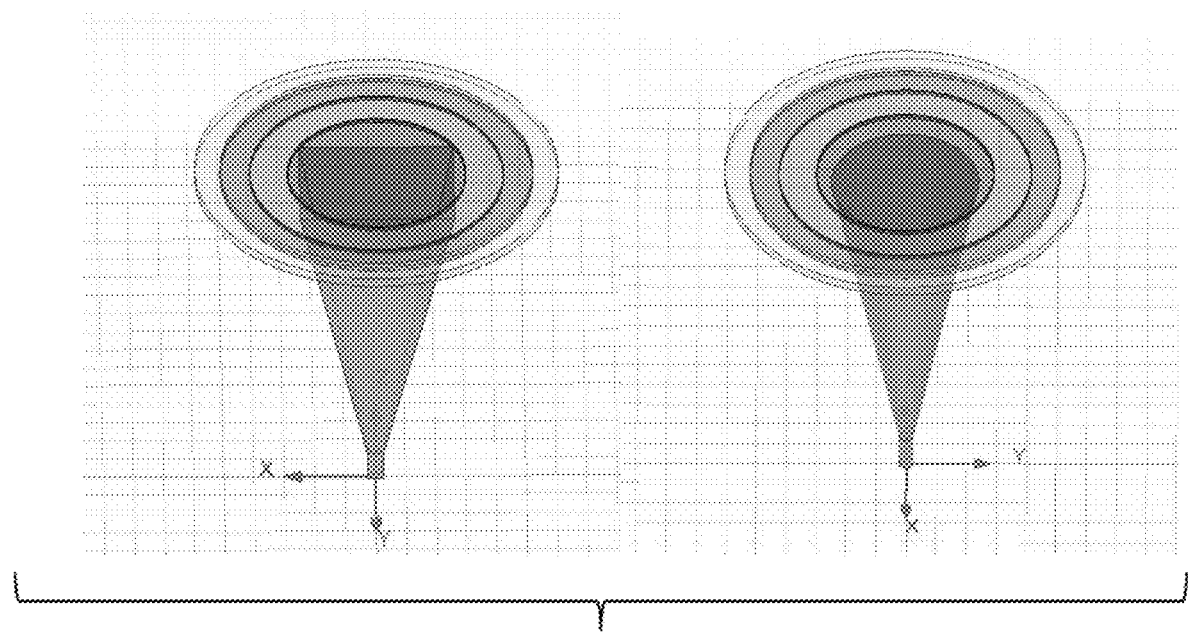
FIG. 16A shows a pyramidal horn antenna (left portion of FIG. 16A) and conical horn antenna (right portion of FIG. 16A) attached with a Fresnel lens in ANSYS HFSS.

An antenna pattern exhibiting a narrow beam is desired to achieve finer resolution. In order to improve the resolution and also place the mWA array within a tight space constraint, low temperature co-fired ceramic (LTCC) antenna fabrication. Fabricating an antenna with high-k dielectric (Er of about 10 or more) with LTCC materials significantly reduces the antenna footprint, thus allowing it to be easily integrated with the printer head. This approach also results in a highly directional antenna with a pencil beam, thus drastically improving the sensor resolution, at the expense of antenna gain. It is important to note that antenna gain is not a critical requirement for the applications of embodiments of the subject invention. When miniaturization with such high directivity is required, a 3D horn antenna topology can be employed (see also the right side of FIG. 16). In order to achieve this, fabrication of a horn antenna array can be performed using LTCC technology with a substrate-integrated waveguide (SIW) and a hybrid stripline transition for packaging and integration.

Advanced manufacturing for the multitrillion dollar electronics industry broadly refers to devices (chips or chiplets), passive components, sensors, thermal and reliability structures, and their integration into electronic substrates. Emerging electronics require thin substrates with high wiring density to interconnect these heterogeneous system components into 3D architectures for shortest interconnect length, provide stable power with low impedance and protect the system. Key to realize this is the ability to enhance the chip functionality, but more importantly achieve the required chip-to-chip interconnect density while meeting the reliability targets with smallest possible form-factor. This trend also advances the design rules through metrics such as wiring and assembly pitch, as illustrated in FIG. 1. Despite tool and process advances, manufacturing is generally limited by the process tolerances and yield. This affects both traditional semi-additively-patterned and emerging additively manufactured substrates.

Embodiments of the subject invention include various design options for mWA sensors to improve inline process control and monitoring for smart future manufacturing. The mWA sensors are designed to detect defects in fabricated circuit patterns. Some classes of defects that can be considered include line discontinuities, line width shifts, and misalignment or changes in the RF reflection (S11). Misalignment can refer to possible shifts in the via center from the pad center due to printing, mechanical errors, or dimensional changes in the substrate. Line width shifts and discontinuities are sensitive to the printing quality and particles agglomerates or aggregates in the ink or paste. The sensors reveal and classify defect information by closely correlating the frequency deviation pattern for a given layout of PCBs. This leads to new ways of monitoring beyond charged coupled device (CCD) vision, AOI, or contact probing. Embodiments can enable advanced manufacturing with lower defect rates while not compromising the evaluation speed and also while reducing the overall manufacturing costs.

In many embodiments, a key element is the mWA probe, which is sensitive to small changes in conductors and dielectrics in its proximity, as shown in FIG. 1. Therefore, when the mWA is above a substrate, its response is sensitive to the conductor's resistivity and discontinuities, line bridging, or other defects in the embedded layers. This is because this substrate (of thickness of about 1-3 mm) acts as a superstrate for the mWA array. Thus, by measuring shifts or characteristics of S11 responses, changes in reactance (primarily impedance/capacitance in this case) can be estimated. S11, also known as the reflection coefficient, measures the amount of signal reflected back from the antenna due to impedance mismatches between the antenna and the feeding line (usually matching to 50 Ohms ($\Omega$)). Changes in the substrate's properties can affect its effective permittivity ($\varepsilon_r$) and permeability ($\mu_r$), which, in turn, influence the antenna's characteristic impedance ($Z_c$). This can lead to a mismatch between the antenna's $Z_c$ and the feeding line impedance, causing signal reflection and a higher S11 value. In addition, by employing the same mWA array, RCS can also be measured, thereby providing information about the metal pattern in the test region. The mWA designs can be optimized such that sensitivity is enhanced for detecting defects in the built-in processes that control monitoring (PCM) structures in the fabricated substrate. This can allow for remote and real-time monitoring of the process deviation, forming a key component of embodiments of the subject invention. Continuous remote measurement of the fabricated features can allow for intelligent manufacturing by adjusting the material processing and deposition conditions in real-time. FIG. 1 shows a schematic illustration of the concept of embodiments of the subject invention.

Figure 2:
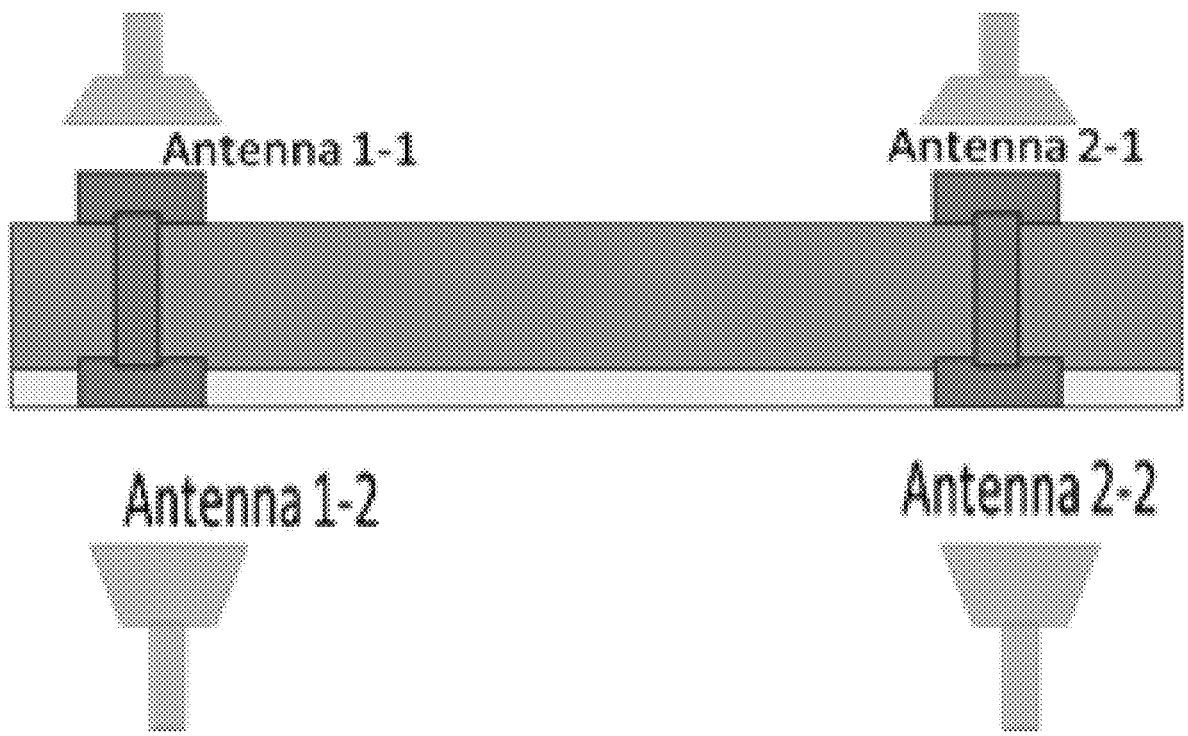
FIG. 2 shows a cross-sectional view of a patch antenna sensor in a tool head and ring resonator located on either side of a substrate, according to an embodiment of the subject invention. The patch antenna sensor is the middle portion on each side shaped like a capital "I".

FIG. 2 shows an embodiment with patch antennas on both sides of a defect. Embodiments with patch antenna on both sides of a defect can be configured for: detecting discontinuity defects in micro-sized ring resonators due to printer malfunctioning; detecting changes in the linewidth/gap in the traces of ring resonator due to printer malfunctioning; detecting layer-to-layer axial misalignment when resonator rings are printed on both sides of the patch (this can be easily extended to detect via-pads misalignment on both sides); and/or via-pad trace extension on the panel side. In an embodiment, a horn antenna and/or lens can be on the printer head, with standard conductor traces on the package.

With respect to a patch antenna on both sides of a defect, configured to Detect discontinuity defects in micro-sized ring resonators due to printer malfunction, this can deal with defects from line discontinuities. These defects are introduced into test structures at the corners of each coupon. The key assumption behind this strategy is that the same process deviations in the actual substrates will be reproduced in the resonator test structures. Therefore, ring resonator structures carry typical process defects and hence can be tracked as process indicators. Notably, these act as the PCM structures. Initial design sensitivity analysis was performed with a patch antenna that has slots. The antenna response demonstrated frequency shifts to microscale discontinuities in the ring resonator.

The setup includes an electronic substrate in between two mWAs, and FIG. 2 illustrates the setup simulated with ANSYS HFSS. Two monitoring antennas can be used either side of the substrate. One antenna can be integrated with the printing head while the other antenna can be underneath the substrate. This setup studies the sensitivity for the defects using S12/S21 parameters. The same analysis can also be performed with a single antenna using S11 parameters. Initial proof for this setup in effectively registering via-pad axial misalignment is shown to be feasible via the resonator ring structure on both sides of substrate.

A patch antenna topology can be selected for this analysis. This is because of the patch's sharp resonance and omnidirectional broadside radiation. These antennas can be fed from the edge (e.g., with a 50$\Omega$ microstrip line). Appropriate quarter wave transformers can be employed for feeding the antennas. In addition, a key feature of this antenna topology can be the introduction of slots inside the patch antenna. These slots can enable size reduction and create a sharp resonance that is sensitive to a nearby resonator pattern in the substrate. When resonator patterns with different geometric features were created, a systematic detectable shift in the S12 resonance peak was detected.

The patch antenna can be designed to operate at 94 GHz. The ring resonator design variations include change in the line discontinuity, line width, and increase in the gap. With variations in the gap, the resonance frequency will undergo a key shift.

With respect to a patch antenna on both sides of a defect configured to detect changes in line width/gap in the traces of ring due to printer malfunctioning, this effect can be studied by changing the line width of the ring traces shown in FIG. 2, which, in turn, can change the gap between the rings printed onto the substrate. During initial studies through simulation, it was found that if the gap between rings is changed from 6 µm to 14 µm or 21 µm, the energy transfer between both antenna ports shifts its frequency response for S21. A single antenna with its S11 parameter shifts can also be used to detect the aforementioned changes. In this case, only amplitude changes are detected for S11. Therefore, the two-antenna system (bistatic) is much more suitable for detecting defects. That is, the IMS captures manufacturing changes because the electrical properties (e.g., resistance, reactance, etc.) influence the impedance of the substrate under monitoring.

Figure 3:
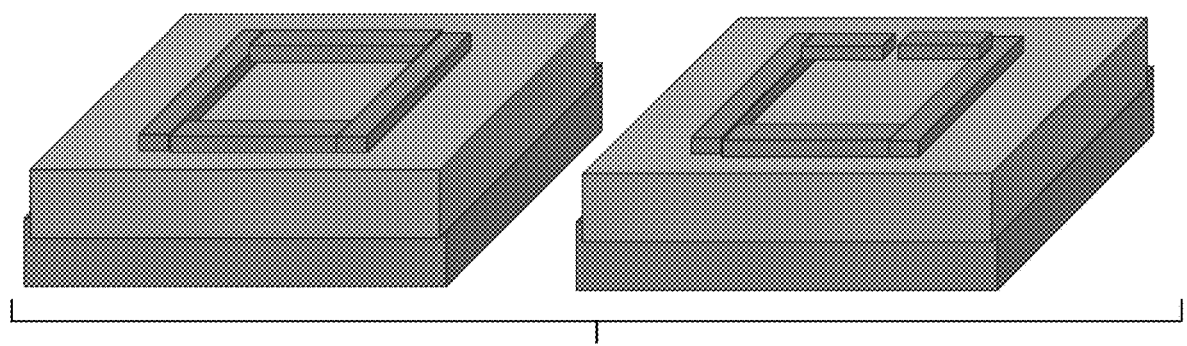
FIG. 3 shows a perspective view of axial misalignment of resonator rings (left portion of FIG. 3) and via pad misalignment (right portion of FIG. 3).
Figure 4:
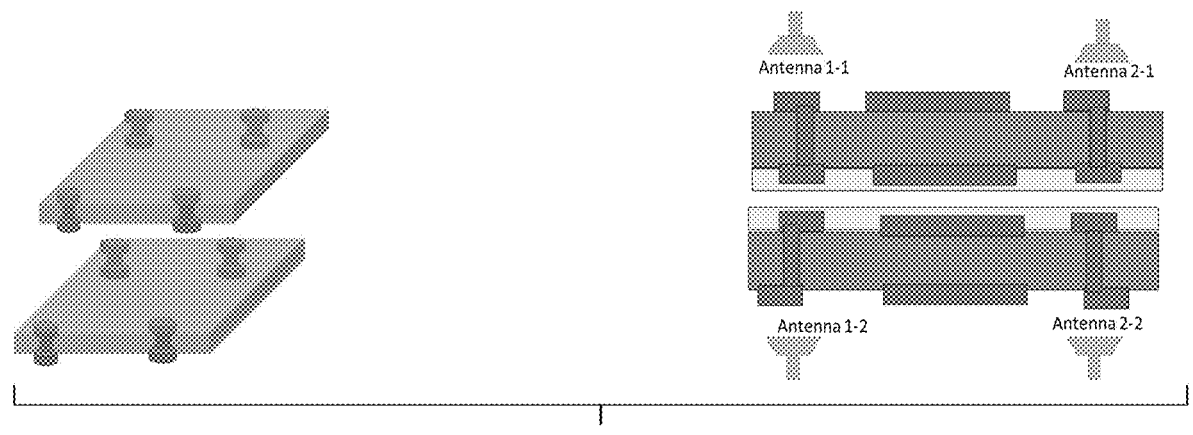
FIG. 4 shows a layer-to-layer axial alignment needed (left portion) and being achieved (right portion) via precise alignment with an antenna sensor, according to an embodiment of the subject invention.

With respect to a patch antenna on both sides of a defect configured to detect layer-to-layer misalignment by detecting axial misalignment of resonator rings, this can be also extended to detect via-pads misalignment on both sides (see also FIG. 3). Resonator rings can be printed on layers, opposite to mating layers, placed in front of antenna on both sides. The antenna scattering parameter S11/S12 can show frequency and amplitude shifts that correspond to axial misalignment (see FIG. 4). The system can fortify the solution by integrating it with AI/ML infusion into the model. More data can be generated through simulations and experimental verification to train an AI/ML algorithm to work at the back end of the setup. The inline monitoring can be validated through individual embedded passive test-structures and high-density interconnects. Via-pad regions, signal feed-points from transmission lines to feeding networks, and matching stubs are the critical regions where defects are frequently generated. These are known as design hot spots. The nature of such defects can be delineated based on the received S-parameter data from the hot-spot locations. This approach offers a distinct advantage as compared to using simple PCMs. The detection advantage is due to system-level impact of the defects that can be now assessed for the minimum-required corrective actions and hence increase productivity and throughput. Off-line direct current (DC) kelvin probe structures can be used to provide response to the conductor geometries and material properties with milliohm accuracy.

These can act as the training datasets to validate the inline S-parameter measurements from mWA. In addition, mm-Wave test structures can also be included to characterize substrate fabrication-related shifts in transmission line return loss, antenna gain, efficiency, and cut-off frequencies. By utilizing these training data sets, ML algorithms can be enhanced for improved sensitivity and specificity. Real-time process modifications in enhancing tolerance and yield have benefits. Notably, the mWA probe S-parameter shape and position can be mapped with respect to the shifts in material and geometry to provide corrective actions. Therefore, product down-time can be reduced. A corresponding analysis on detecting layer to layer misalignment can be done by inducing a defect with, for example, approximately 20 µm misalignments on any of the four sides (e.g., −X, +X, −Y, or +Y). The resulting IMS can show resonance at multiple frequencies for S21 output with the resulting resonance pattern classified based on the type of misalignment and then used as a data point to train an AI/ML algorithm.

Figure 5:
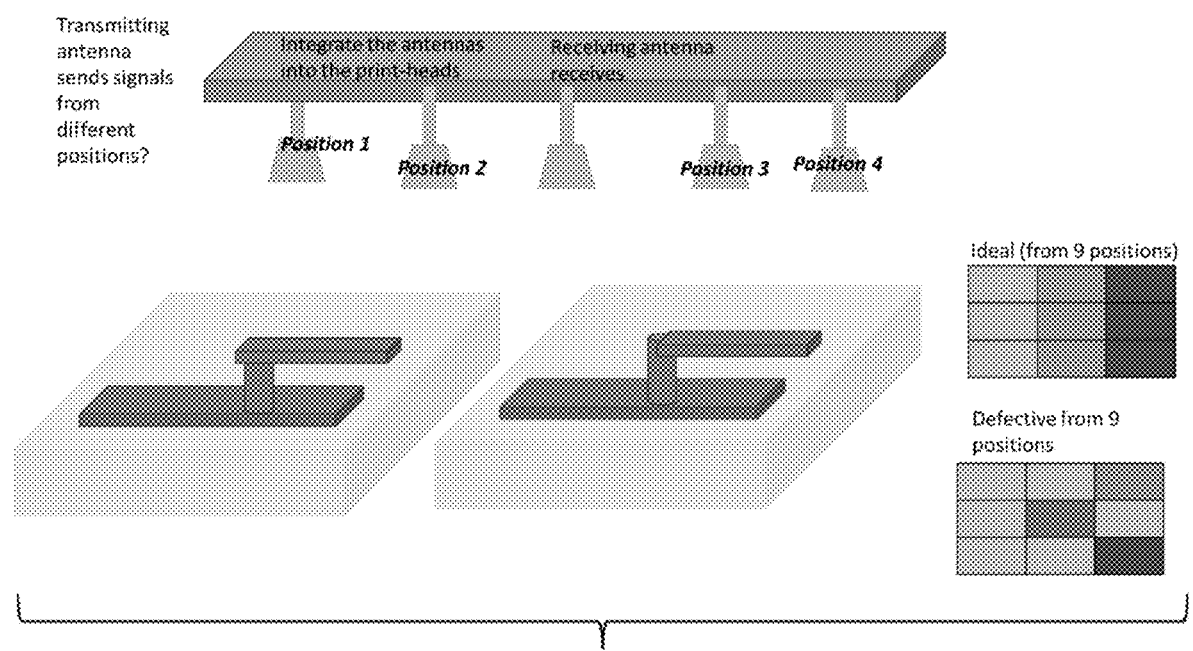
FIG. 5 shows a patch antenna in a tool head and via-pad structure as the probe structure, according to an embodiment of the subject invention.

With respect to a patch antenna on both sides of a defect configured for via-pad misalignment, a patch antenna can be on the top and bottom of a panel. The capacitive shifts from ring resonator misalignment and via-pad misalignments can be captured from parameters such as S11 and S12. The side-by-side antennas can clearly sense the one-port reflection loss, as illustrated in FIG. 5. Notably, productivity and throughput can be further enhanced by combining the antenna sensors with a network analyzer incorporating a trained ML algorithm for an inline monitoring system. A single antenna with its S11 parameter shifts can also be used to detect the aforementioned changes.

With respect to patch antennas, for defect, via-pad opening, and misalignment monitoring, the distance between the top and bottom antennas can be in a range of, for example, 0.2 millimeters (mm) to 10 mm. The distance between the top antenna and the substrate can be in a range of, for example, from 0.1 mm to 5 mm. In some applications, it is of high interest to detect lateral shifts in the features because of errors in lithography, sliding of die during molding, or layer to layer misalignment. The mWA can also be trained to detect such die shifts and quantify them. They can essentially attain the S11 or S12 parameters from features (such die pad location, RF circuit feature positions, interconnect pad positions, etc.) and correlate them with the ideal position to predict the misplacement. The mWA can essentially come to an expected position and detect the S-parameter response from the feature, which is invariably shifted because of process and design errors. The mWA data can be used to back-calculate the shift in the die pad features, RF features, or interconnect features and inform the tool for corrective actions. The tools that can perform corrective action can include laser drilling, 3D printing, laser trace interconnect formation, and others. The corrective actions from these can include pad-less interconnect formation, impedance-matched and impedance-adjusted interconnect formation, shortest-resistance interconnect formation, least-interference interconnect formation, and others. These are of extremely high importance for future smart manufacturing.

With respect to a horn antenna and lens on a printer head (standard package traces on the package), a highly directive antenna/sensor can be developed. Multiple antenna options could result in high-gain beam towards the detect to enhance detection. Among directive antennas to be used are horns, reflectors, and antenna arrays. However, these antennas may also be bulky. To minimize their size, one option is to increase the resonant frequency or frequency of operation. Further, defects can be identified on the order of tens or hundreds of µm using a highly collimated or directive beam. This requires use of antenna arrays or beamforming circuits, which makes the remote sensing circuitry complex. Alternatively, a passive lens can be designed to perform collimation. The latter is a simple and cost-effective approach with reduced size, weight, power and cost (SWAP-C). One option is an antenna designed to operate a particular frequency (e.g., 94 GHZ), and another option is a Fresnel lens for beam collimation.

In an embodiment, an electronic manufacturing tool that generates electronic circuit traces on a substrate can include printing tools, assembly tools, and/or lithography tools. An antenna sensor can be provided on at least one side of the substrate, such as a first antenna sensor acting as a transmitter and a second antenna sensor acting as a receiver, thereby providing a unique and highly accurate bistatic sensing to overcome system noise. Defect monitoring structures can be provided on the substrate. The antenna(s) can generate S-parameter datasets, and the datasets can be utilized to identify the nature of the defect sets versus reference responses, and this can be done to provide tool process corrections. The antenna(s) can have dual patch topology. The antenna(s) can have grooves for higher Q resonance and/or for multiple resonances to enhance detection. The defect monitoring structures can be ring resonators with multiple resonance using grooves. The antenna(s) can have Yagi topologies for higher directivity. The defects can be, for example, line discontinuities and/or line width changes.

In an embodiment, an electronic manufacturing tool that generates electronic circuit traces on a substrate can include a first antenna sensor placed on one side of the substrate, acting as a transmitter, and a second antenna sensor placed on the other side of the substrate acting as receiver. Via and pad structures can be included on the substrate. The antennas can generate S-parameter datasets that indicate the via-pad alignment, and the datasets can be utilized to identify the nature of the defect sets, and this can be done to provide tool process corrections. The antennas can have a patch topology. The antenna can have grooves to improve resonance and allow for multiple resonances. The defect monitoring structures can be ring resonators. The antennas can have spiral topologies. The defects can be, for example, via-pad shifts (such as via-pad shifts of 5 microns or more).

In an embodiment, an electronic manufacturing tool that generates electronic circuit patterns on a substrate can include a first antenna sensor on one side of the substrate and a second antenna sensor on the other side of the substrate. Conductor traces can be included on the substrate. The antennas can generate S-parameter datasets that indicate the via-pad alignment. This can generate datasets that can be utilized to identify the nature of the defect sets, and this can be done to provide tool process corrections. The antennas can have a horn topology. The antennas can be coupled with a lens to reduce the aperture and narrow the bandwidth for higher resolution. The antennas can be scanned at different locations and angles. The defects can be, for example, line discontinuities and/or line width changes.

Embodiments of the subject invention provide a focused technical solution to the focused technical problem of identifying defects in the manufacturing process for electronic substrates and/or devices. The solution is provided by using antenna sensors disposed proximate to the substrate to gather S-parameter data, which can be analyzed (e.g., using AI and/or ML) against reference data to identify the presence and nature of defects present in the substrate.

The methods and processes described herein can be embodied as code and/or data. The software code and data described herein can be stored on one or more machine-readable media (e.g., computer-readable media), which may include any device or medium that can store code and/or data for use by a computer system. When a computer system and/or processor reads and executes the code and/or data stored on a computer-readable medium, the computer system and/or processor performs the methods and processes embodied as data structures and code stored within the computer-readable storage medium.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); network devices; or other media now known or later developed that are capable of storing computer-readable information/data. Computer-readable media should not be construed or interpreted to include any propagating signals. A computer-readable medium of embodiments of the subject invention can be, for example, a compact disc (CD), digital video disc (DVD), flash memory device, volatile memory, or a hard disk drive (HDD), such as an external HDD or the HDD of a computing device, though embodiments are not limited thereto. A computing device can be, for example, a laptop computer, desktop computer, server, cell phone, or tablet, though embodiments are not limited thereto.

When ranges are used herein, combinations and subcombinations of ranges (including any value or subrange contained therein) are intended to be explicitly included. When the term "about" is used herein, in conjunction with a numerical value, it is understood that the value can be in a range of 95% of the value to 105% of the value, i.e. the value can be +/−5% of the stated value. For example, "about 1 kg" means from 0.95 kg to 1.05 kg.

A greater understanding of the embodiments of the subject invention and of their many advantages may be had from the following examples, given by way of illustration. The following examples are illustrative of some of the methods, applications, embodiments, and variants of the present invention. They are, of course, not to be considered as limiting the invention. Numerous changes and modifications can be made with respect to embodiments of the invention.

Example 1—Detecting Line Discontinuities with Antenna Parameter Shifts

Figure 6A:
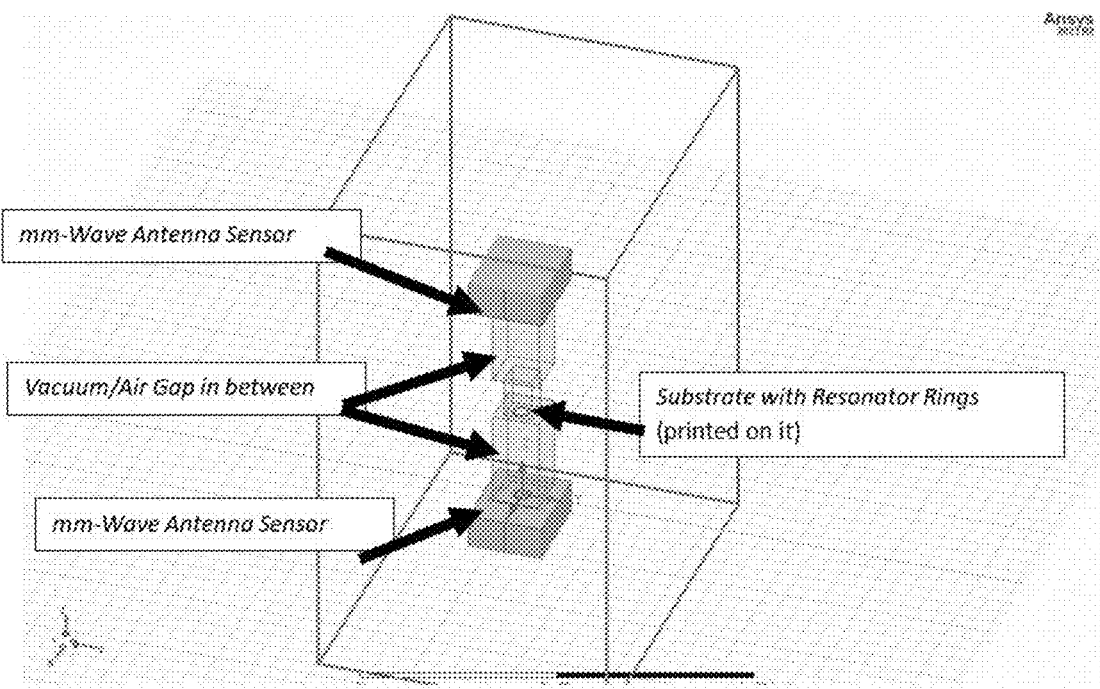
FIG. 6A shows a setup for an inline monitoring setup (IMS) with an antenna probe shown on top and bottom and a defective ring printed onto a substrate.
Figure 6B:
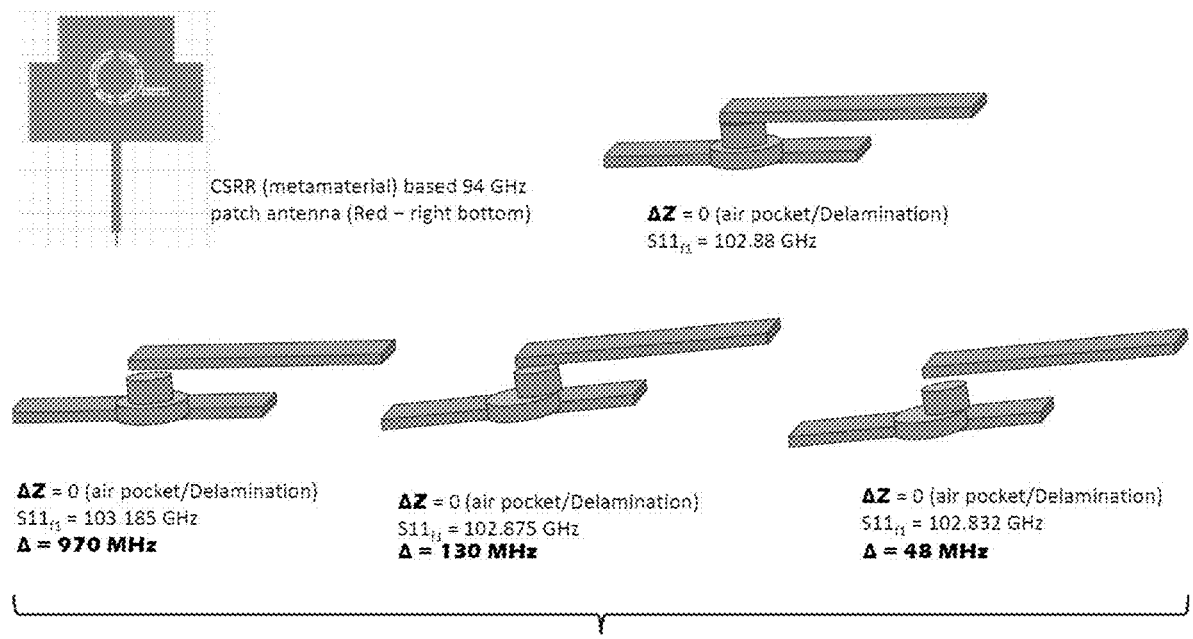
FIG. 6B shows exemplary S11 parameter shifts from FIG. 6A.
Figure 7:
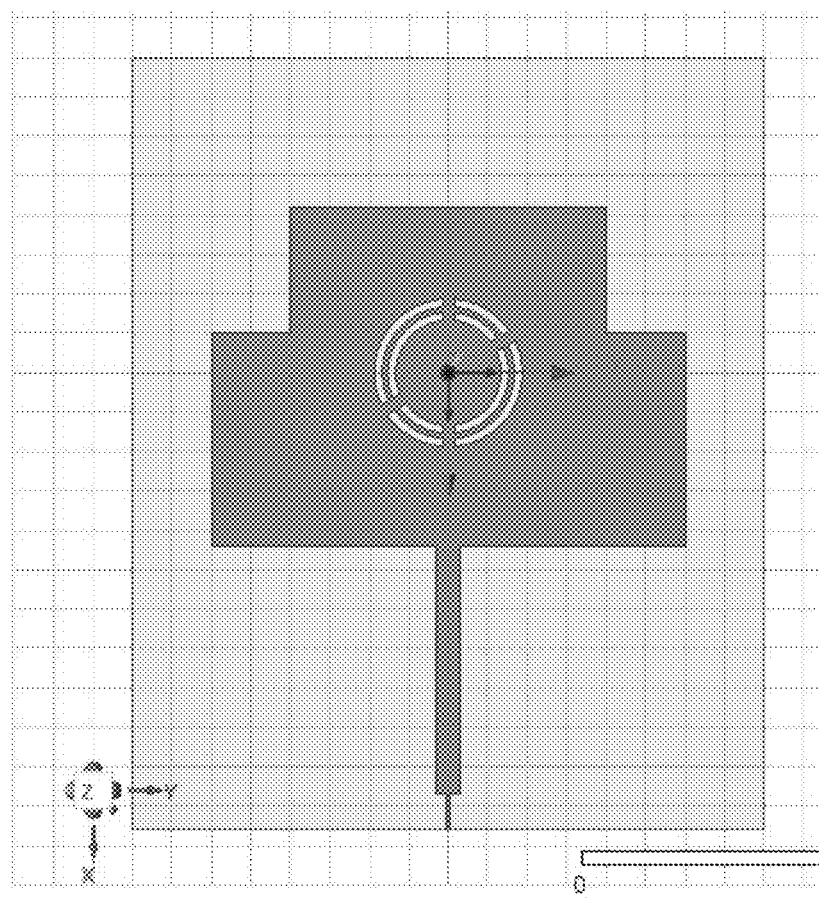
FIG. 7 shows a top view of an antenna Sensor with circular slots used in the top and bottom of the IMS.

Simulation experiments were set up to investigate the sensitivity of mWA antennas for μm-size defects. The simulation experiments (through ANSYS toolsets) were setup to look through a large spectrum from 20 GHz to 200 GHz for the aforementioned defects. FIGS. 6, 7, and 8A-8D show the details of the setup and the nature of ring defects below. The antenna arrangement is shown in FIG. 6A, and the exemplary S11 parameter shifts are shown in FIG. 6B.

Figures 8A, 8B, 8C, 8D:
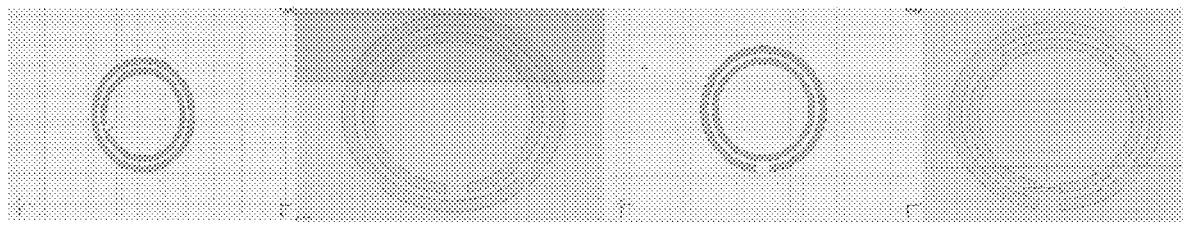
FIG. 8A shows a baseline ring resonator.
FIG. 8B shows a 20 millimeter (mm) discontinuity in the inner ring.
FIG. 8C shows a 20 mm discontinuity in the outer ring.
FIG. 8D shows a 20 mm discontinuity in the inner ring.
Figure 8E:
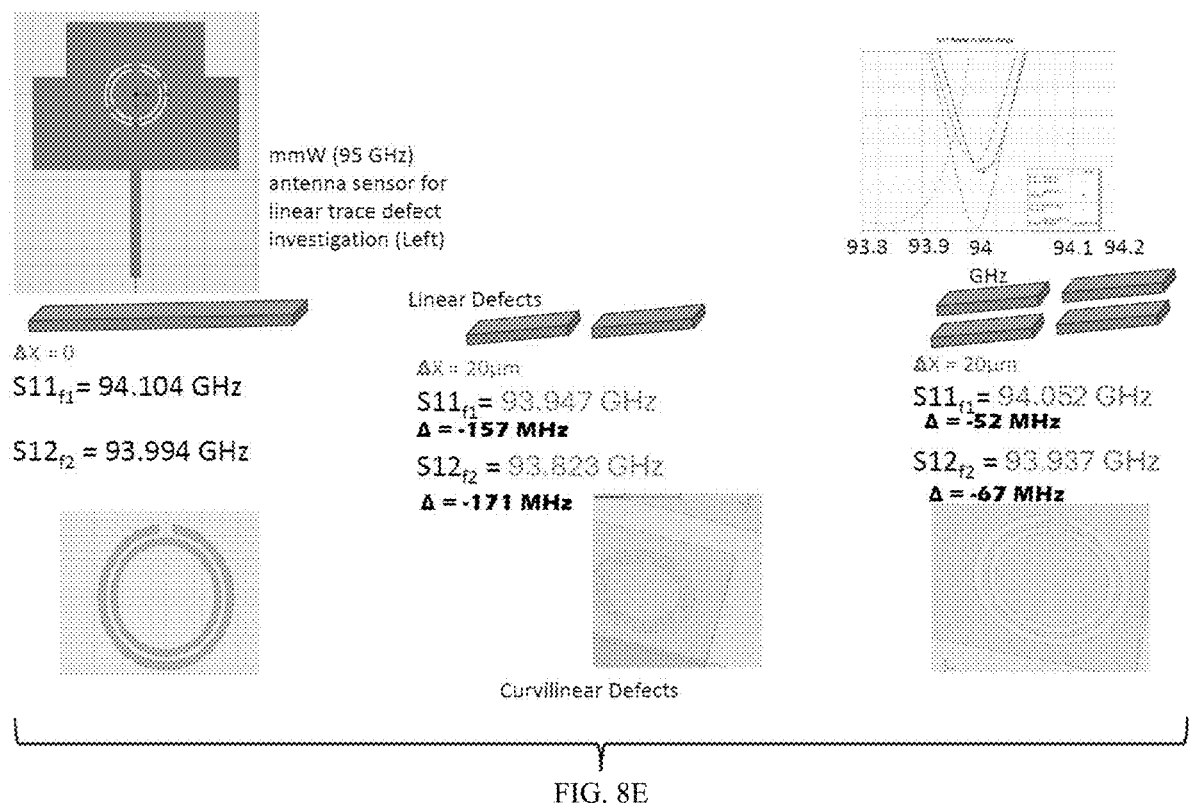
FIG. 8E shows a summary of studies.
Figure 10:
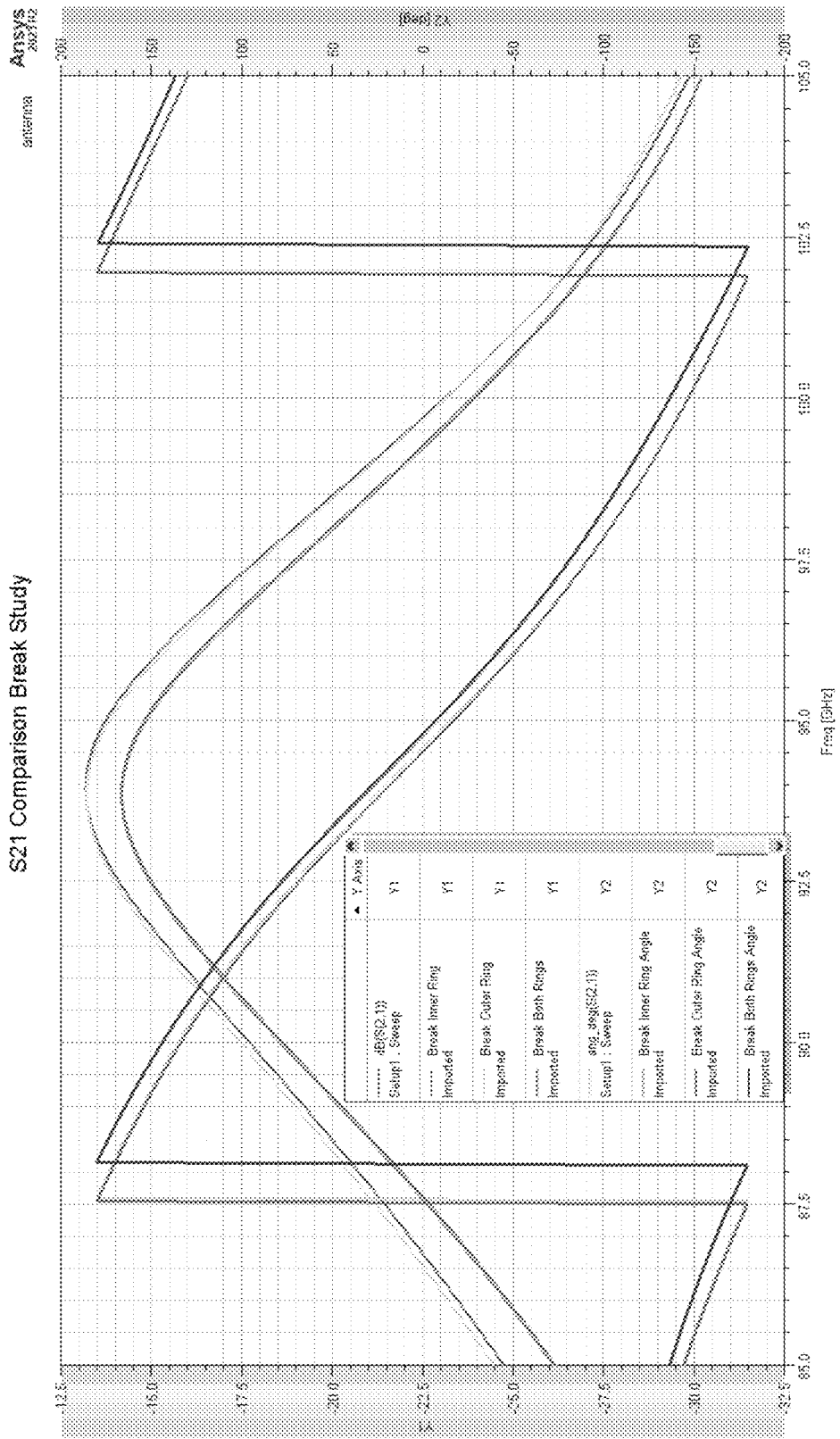
FIG. 10 shows a plot of the S21 and corresponding phase shifts with 20 mm discontinuity in either or both rings.
Figure 11:
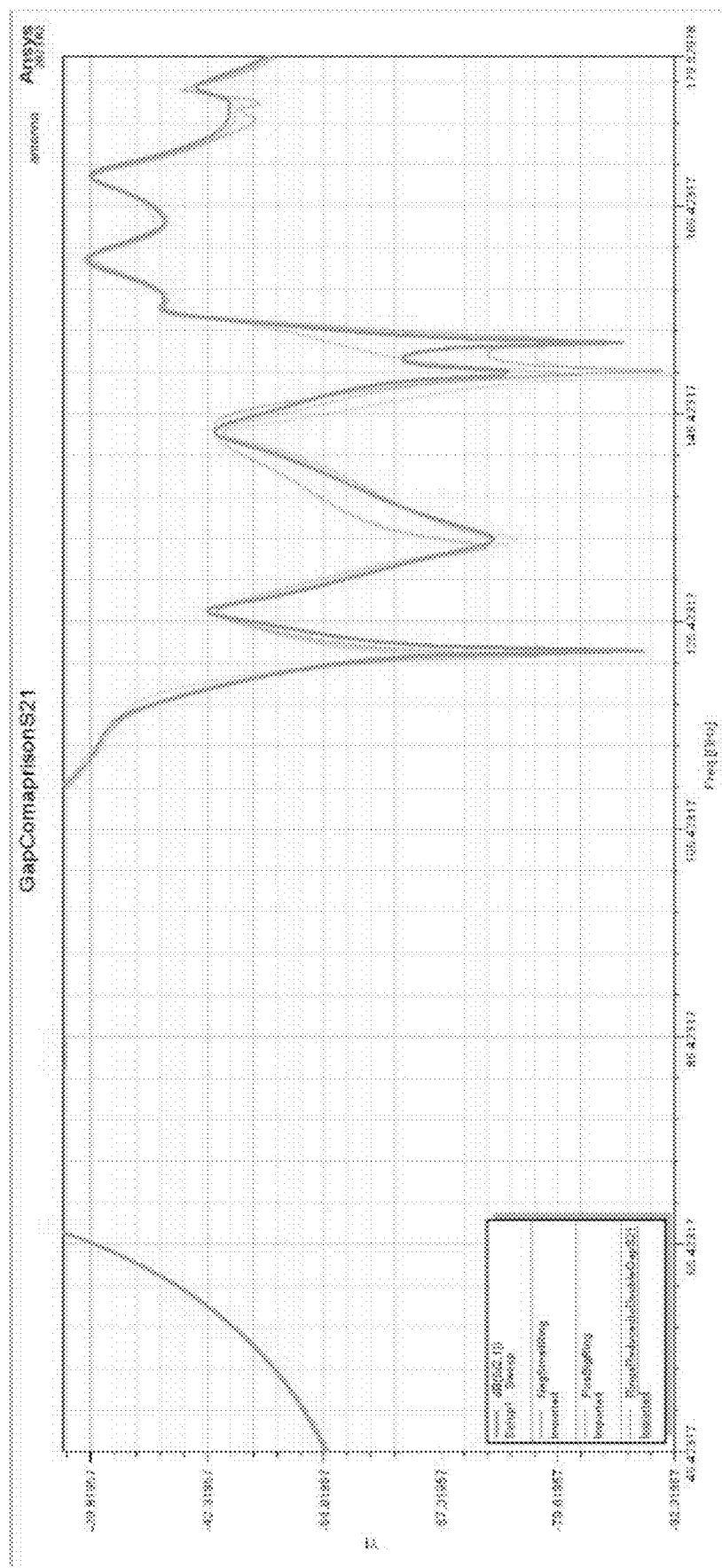
FIG. 11 shows a plot of the S21 frequency shifts with shifts in gap spacing between concentric rings.

Frequency response/shift for operation around 94 GHz as relates to the defects in FIG. 11 varied from 2.69 megahertz (MHz) to 111.35 MHz for a break of 20 μm. The results are summarized in the table in FIG. 17 as small shifts cannot be visually captured. The table in FIG. 17 gives the details of IMS frequency response for S11/S21 parameters and refers to a standard (STD) resonator ring (including the baseline ring resonator structure without breaks) with discontinuity defects as depicted in FIG. 8A. The summary of studies is shown in FIG. 8E. The same tabulated results can be observed for FIG. 9 and FIG. 10. The scattering parameters shift from the shifts in the substrate electrical characteristics because of the induced discontinuities.

Example 2—Detecting Inline Width/Gap in the Traces of Rings Due to Printer Malfunctioning The IMS setup is shown in FIG. 2 and is again used to detect the gap between the rings (inner ring and outer ring) of the resonator. The setup for monitoring refers to the cases below:
 (i) The baseline ring resonator (STD ring) for 'standard gap' of 6.86 μm between inner and outer ring.
 (ii) Gap was tripled (~3.02 times) to 20.56 μm by reducing the radius of the inner ring, but keeping the width of rings as before.
 (iii) Gap was tripled (~3.02 times) to 20.56 μm by increasing the radius of the outer ring, but keeping the width of rings as before.
 (iv) Gap was increased (~1.2-2.05 times) to 13 μm by reducing the trace width of the inner and outer ring, each by 3.43 μm.

A summary of the frequency shifts for the above cases is illustrated in the tables in FIGS. 18 and 19. Although the table in FIG. 18 shows only amplitude sensitivity for the S11 parameters for the above four cases ((i)-(iv)), the table in FIG. 19 recognizes that both amplitude and frequency are sensitive to the 'gap' changes at the micron scale. The amplitude shift by the IMS system is registered because gap changes at the micron level result in impedance changes causing an amplitude shift.

FIG. 11 and the table in FIG. 19 show the S21 response of the IMS system. The resonating frequency response is shown in the "Freq" column in FIG. 19, as well as the first row of the second column, the second row of the third column, the third row of the fourth column, and the fourth row of the fifth column. The table in FIG. 19 clearly indicates that IMS is frequency-sensitive to the gap width changes from standard to double or triple between the rings. The defects can be addressed by the IMS feedback, either by changing the material or process conditions. In summary, the embodiments of the subject invention can detect all micro range defects, demonstrating efficacy. Notably, the bistatic (S21/12) measurement is important as this approach maintains better sensitivity due to the isolation of the transit and receive signals. Table 3 summarizes the frequency shifts by altering the gap.

Example 3—Detecting Axial Via-Pad Misalignment with Antenna Parameter Shifts

Figure 12A:
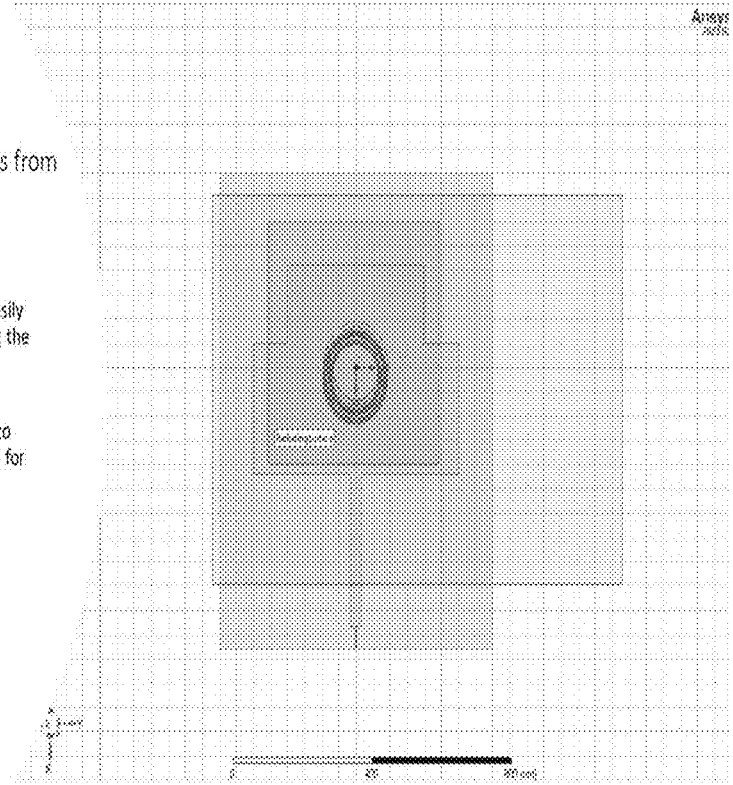
FIG. 12A shows the response for S11 and S21 for the axial shift of ring resonator (RR) in the (+y/+x) positive and (−y/−x) negative directions.
Figure 12A:
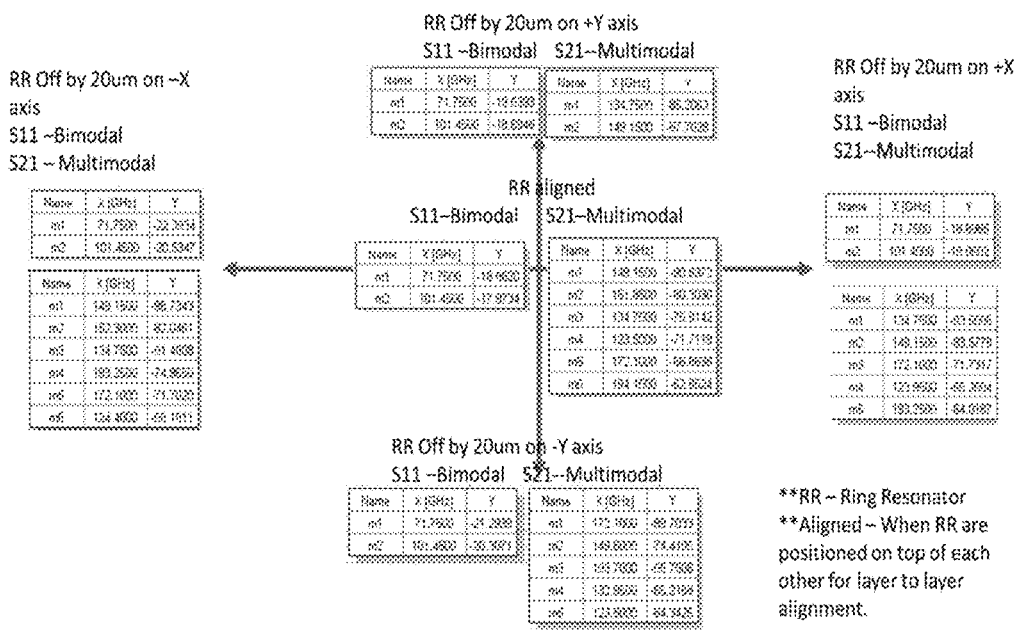
Figure 12B:
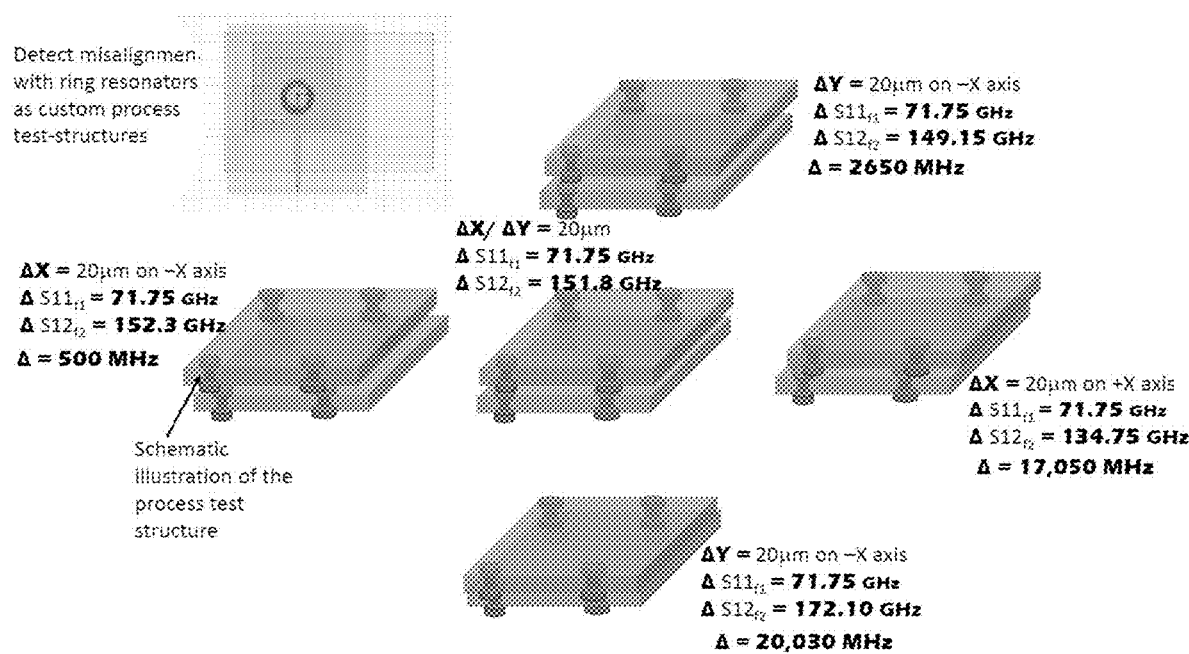
FIG. 12B shows a summary of shifts from FIG. 12A.

To investigate defects such as axial misalignment, the resonator ring on one side of the substrate was moved by 20

µm in four axial directions and separated by ninety degrees. This approach induces the desired defects of axial misalignment. Based on simulations, IMS detects these defects of misalignment as FIG. 12 shows that the introduced IMS detects only amplitude shift for S11 parameter at the two resonating frequencies. However, as noted above, S21 shows resonance shifts at five or six frequencies over a large range that varies for all the four cases of axial misalignment. Therefore, S21 is the choice parameter to use for more robust defect detection. The exemplary raw S11 and S12 parameter numbers are shown in FIG. 12A, and the summary of shifts is shown in FIG. 12B.

Simulations confirm that the defect pattern can be classified because the scattering parameters show significant shifts in the resonant frequency. The axial misalignment is detectable in the µm range because it creates a relative change in the electrical properties of the substrate. If trained with the help of AI/ML, the system can become a robust classifier to identify the defects of misalignment.

Example 4—Patch Antenna on Both Sides-Via-Pad Misalignment on the Panel Side

Via-pad misalignments can be tracked with an IMS setup similar to that done for the axial misalignment. The ring resonators can be printed near the location of via-pads, thereby tracking any errors due to printer or metal deposition. These ring resonators can be printed as collocated to detect possible defects while assembling them together.

Example 5—Horn Antenna and Lens on the Printer Head-Standard Package Traces on the Package Simulations were run using a horn antenna and a focusing element such as a lens, and they can be divided into two parts: a) horn antenna optimization; and b) lens design.

Figure 13A:
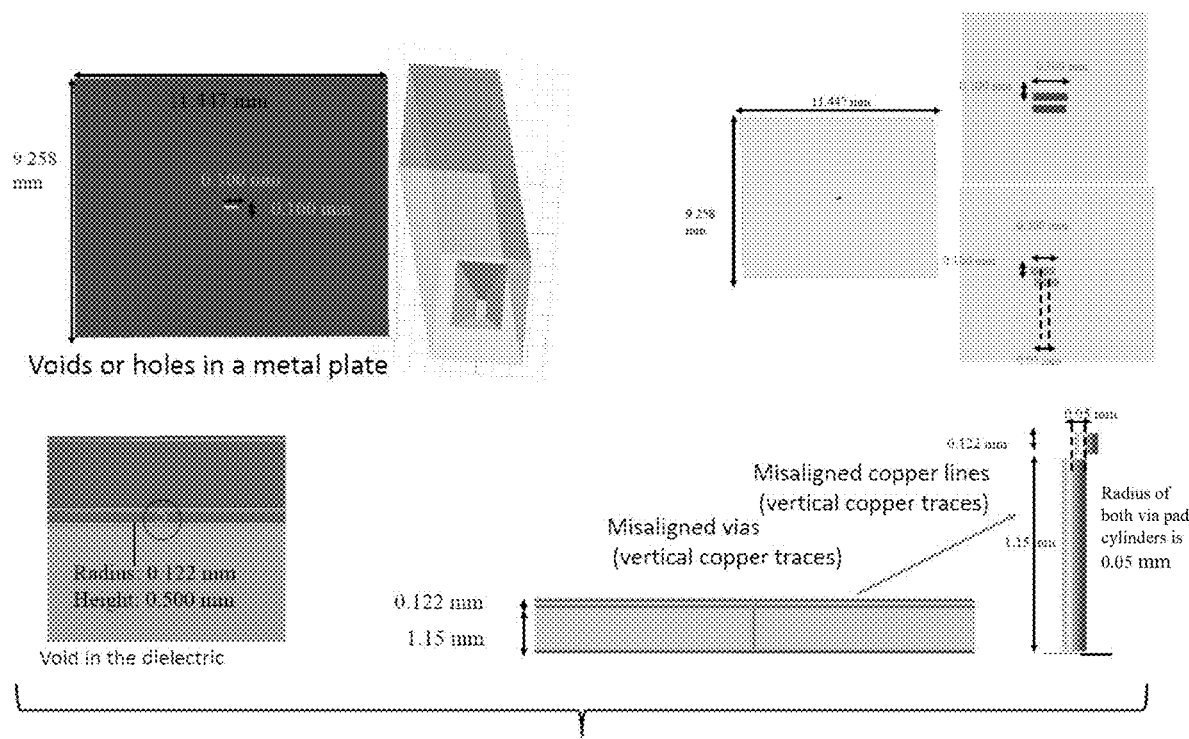
FIG. 13A shows a pyramidal horn antenna and various defect scenarios for horn antennas.
Figure 13B:
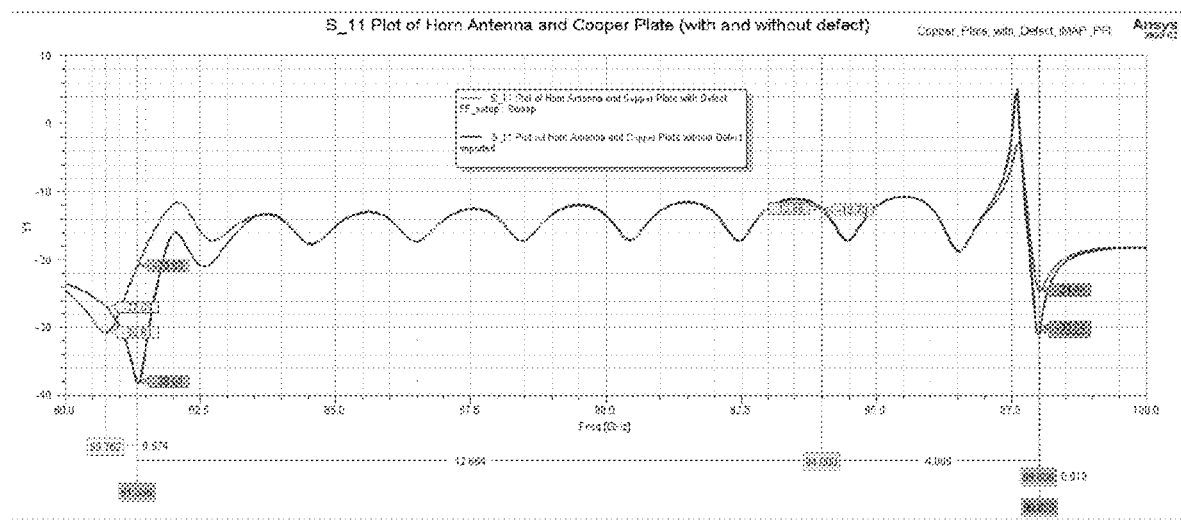
FIG. 13B shows superimposed S11 plots (versus frequency (in GHz)) for a horn antenna and a copper plate (with and without defect). The curve with the highest S11 value at 82 GHz is for "with defect", and the other curve is for "without defect".
Figure 13C:
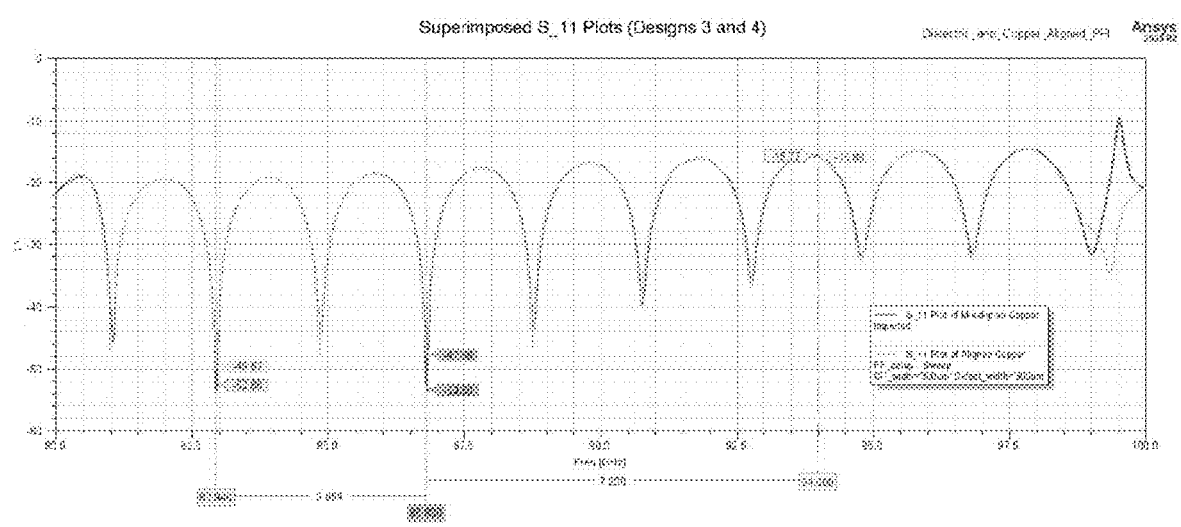
FIG. 13C shows superimposed S11 plots (versus frequency (in GHz)) for a horn antenna and dielectric with copper (aligned and misaligned). The curve with the highest S11 value at 99.5 GHz is for "misaligned", and the other curve is for "aligned".
Figure 13D:
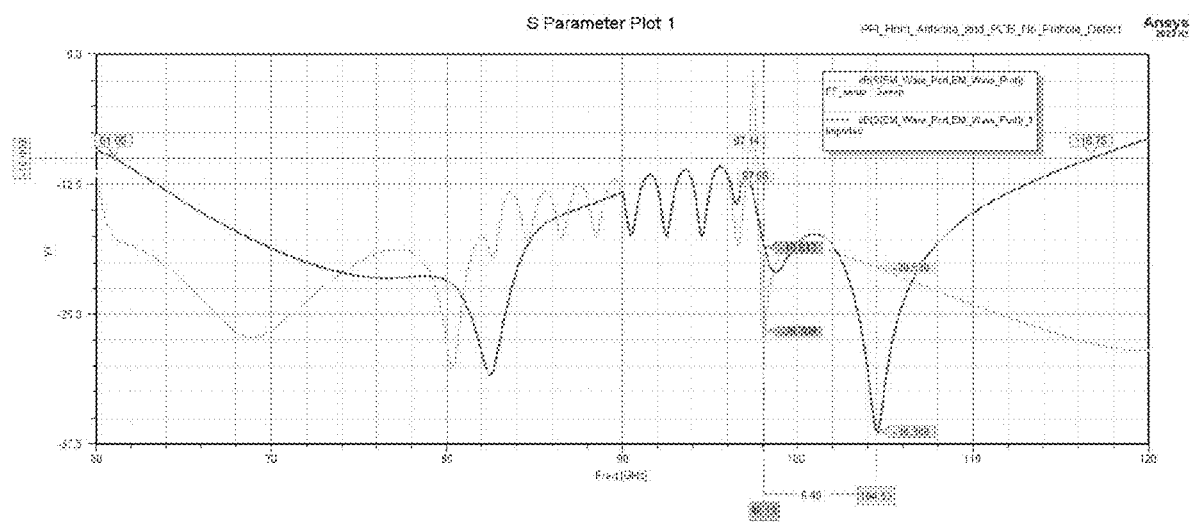
FIG. 13D shows superimposed S11 plots (versus frequency (in GHz)) for a horn antenna and a printed circuit board (PCB) structure (with and without pinhole). The curve with the highest S11 value at 65 GHz is for "with pinhole", and the other curve is for "without pinhole".
Figure 13E:
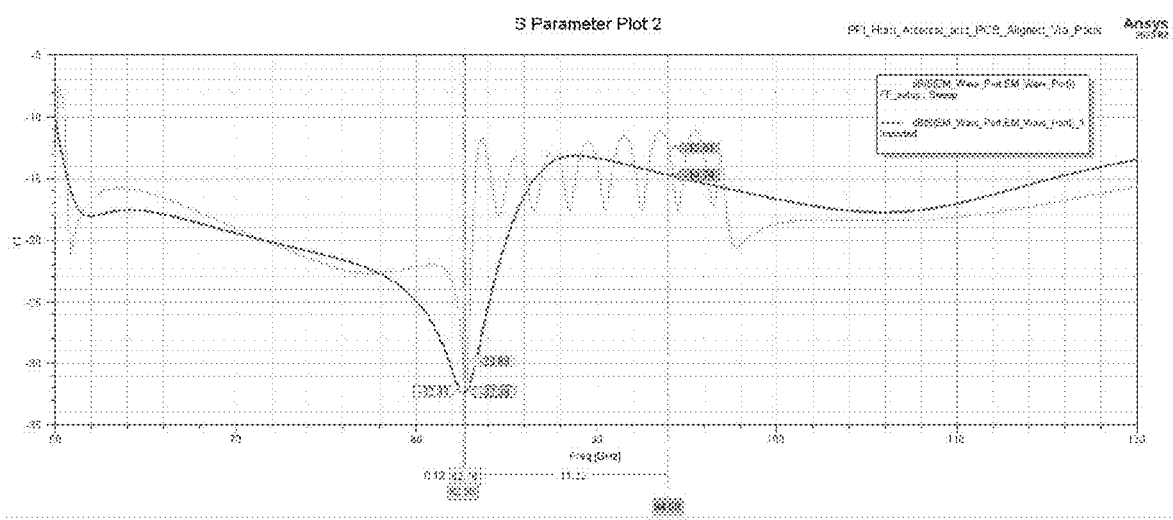
FIG. 13E shows superimposed S11 plots (versus frequency (in GHz)) for a horn antenna and a PCB structure (via pads aligned and misaligned). The curve with the highest S11 value at 82 GHz is for "via pads misaligned", and the other curve is for "via pads aligned".
Figure 14:
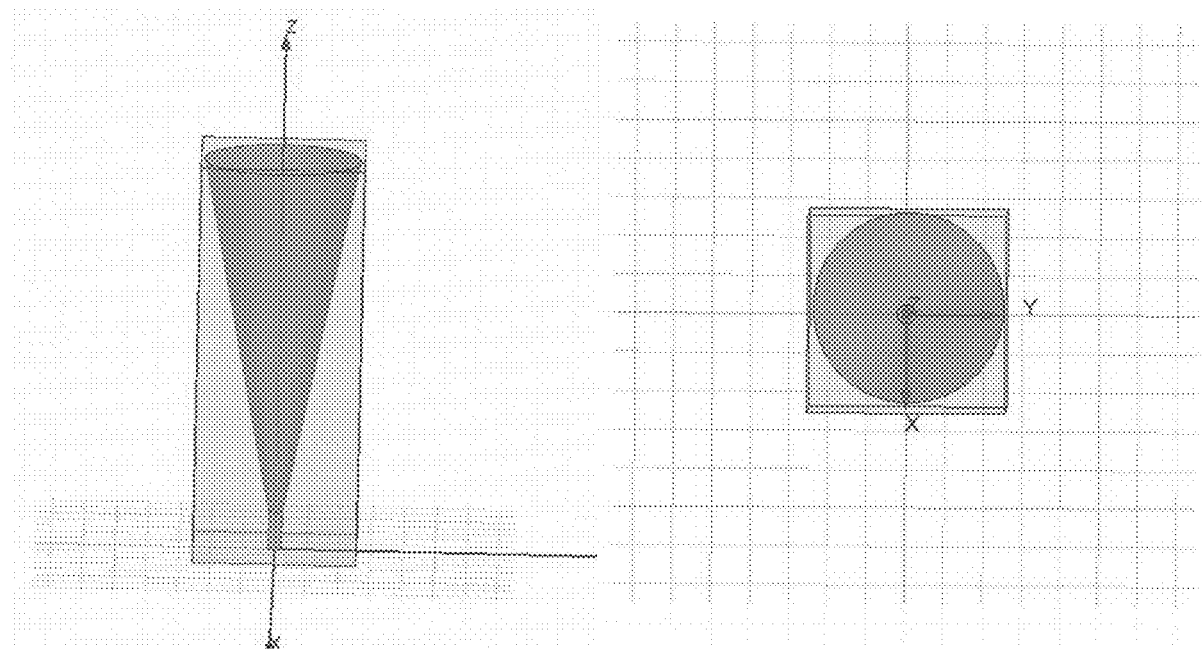
FIG. 14 is a conical antenna design (side view on the left portion of FIG. 14 and top view in the middle portion of FIG. 14), along with a and 3D polar plot of realized gain.
Figure 14:
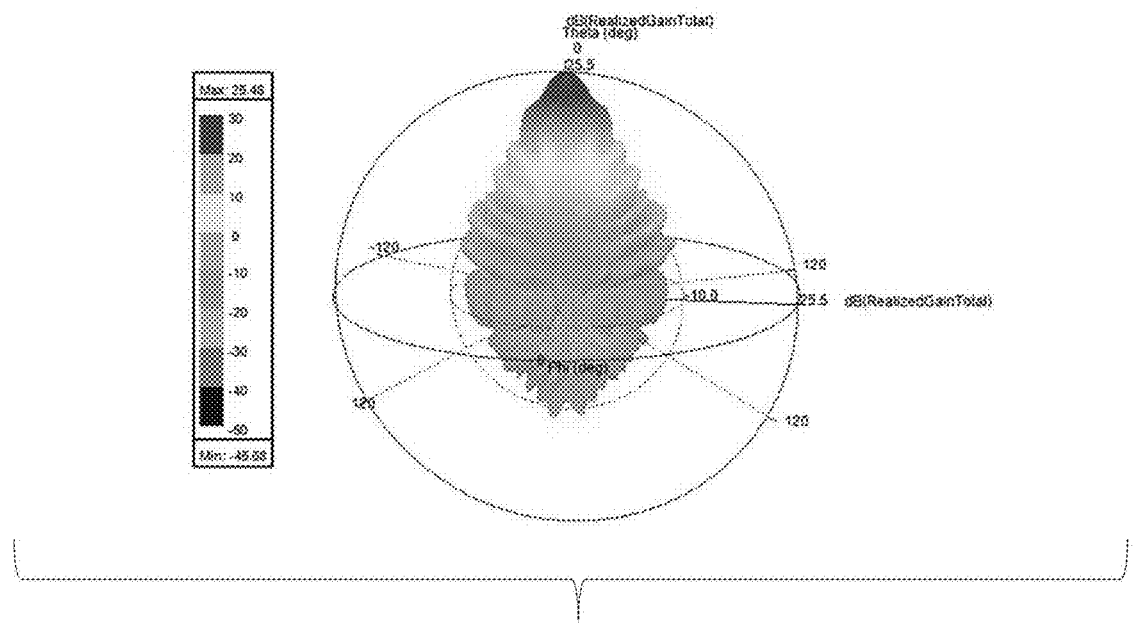

With respect to horn antenna optimization, the horn antenna was designed to resonate at 94 GHz. The dimensions of a pyramidal horn antenna, conical horn antenna, and the dimensions of the Fresnel lens were calculated through MATLAB. The antennas and lens were designed and simulated in ANSYS HFSS. First, the design of the pyramidal horn antenna was considered as in FIG. 13A. The maximum realized gain was 25.24 dB as shown in FIG. 13A, and the half power beamwidth (HPBW) was around 10 degrees. The designed conical horn delivered a realized gain of 25.46 dB as in FIG. 13A and FIG. 14.

Various scenarios are shown regarding the validation of the horn antenna performance. Different defect scenarios are captured, and the deviation in the antenna S11 parameters are demonstrated through simulations. The defect scenarios are shown in FIG. 13A; various defect scenarios are shown in FIGS. 13B to 13E; and the dimensions are also shown in FIG. 13A.

Figure 15:
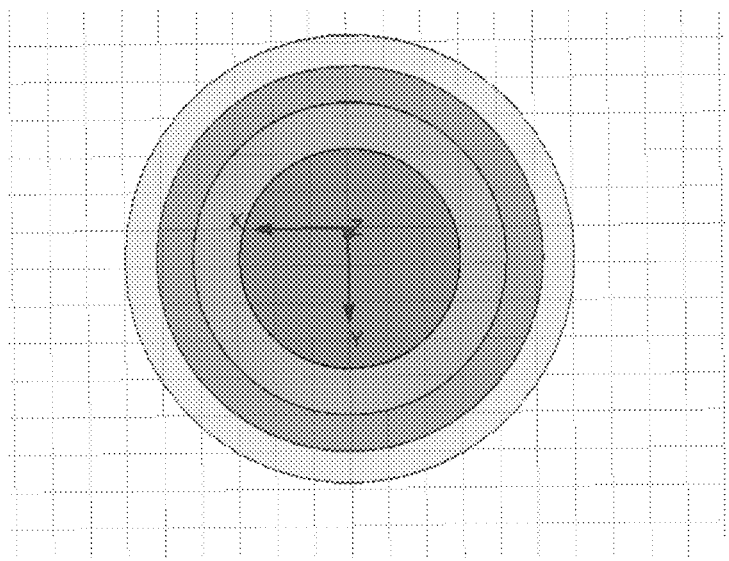
FIG. 15 shows a Fresnel Lens in ANSYS HFSS.

Key challenges were encountered in the integration of the Fresnel Lens with the horn antenna. The electrical length of the system escalates with the lens design and increases the overall computational demands. Therefore, full-wave simulations cannot be used. Instead, ray optics are more preferred for designing the lens integration with the horn. It is necessary to first identify the horn's phase center, and for this a phase center calculator was developed using a MATLAB code (see also FIGS. 13-15).

Figure 16B:
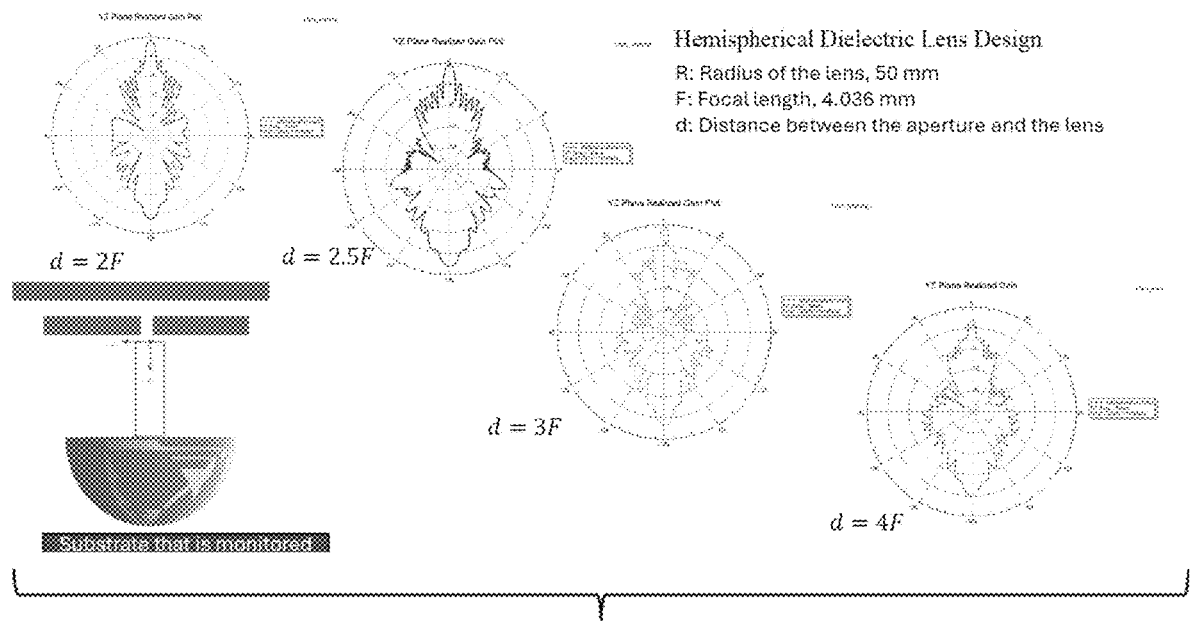
FIG. 16B shows an improvement in defect sensitivity using a patch antenna and a lens, according to an embodiment of the subject invention.
Figure 16C:
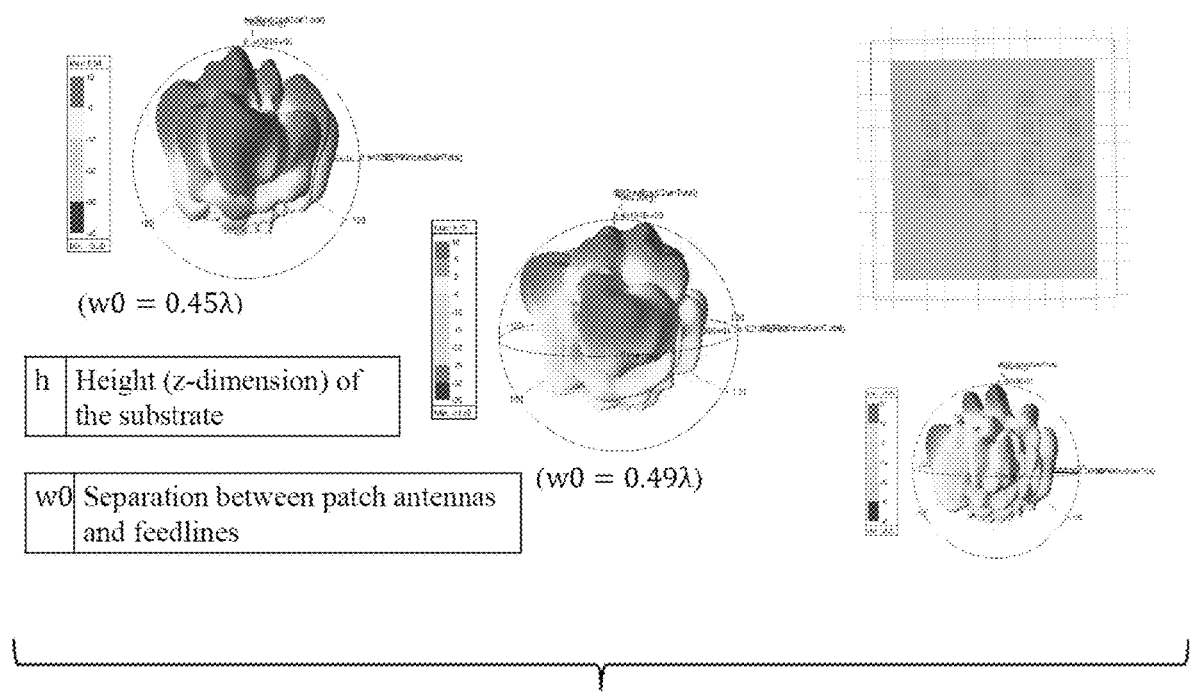
FIG. 16C shows an improvement in defect sensitivity using antenna array sensors, according to an embodiment of the subject invention.

With respect to lens simulation, the function of a lens is to focus the radiation beam. This improves directivity and horn gain. The Fresnel lens accomplishes this. The two main types of Fresnel lenses are the grooved one and the perforated one. The grooved lens is made up of one dielectric material with phase correction being done by changing the thickness of each subzone in the Fresnel lens. In the perforated lens, each subzone across the surface of the lens has the same thickness, but the dielectric permittivity of each section may be different. After obtaining the dimensions of the Fresnel lens, the horn antenna can be redesigned to achieve the best possible performance (see also FIG. 16). The role of the lens can also be shown with a patch antenna. This is illustrated in FIG. 16B, where the distance between the patch and the lens is varied. As the distance between the lens and the antenna is increased, the gain improves. The dimensions are also added to FIG. 16B. The lens can be close to the monitoring substrate, and the antenna can thus be far away. This gives many advantages during implementation as the mWA electronics can be far away from the substrate, and only the lens needs to be in proximity to the monitoring substrate. The lens will improve the sensitivity to antenna defects because of its increased gain. A horn antenna can also be built and integrated with the lens. In another embodiment, a lens array can also be used to increase the antenna gain and focus the beam. This can also achieve higher antenna resolution (as shown in FIG. 16C) and provide higher defect sensitivity.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A system for inline monitoring of a manufacturing process, the system comprising:
   a first antenna sensor disposed on a first side of a substrate of an electronic device being manufactured during the manufacturing process, the first antenna sensor being configured to operate as at least one of a transmitter and a receiver;
   a processor; and
   a machine-readable medium in operable communication with the processor,
   the first antenna being configured to generate a dataset of S-parameter data from the substrate and to transmit the dataset to the machine-readable medium,
   the machine-readable medium having instructions stored thereon that, when executed by the processor, perform the following steps:
   receive the dataset from the first antenna;
   analyze the dataset to identify a defect in the substrate by comparing the dataset to reference data; and
   provide process corrections to a user of the system to address the identified defect in the substrate.

2. The system according to claim 1, the first antenna sensor being a millimeter (mm) wave (mmWave) antenna (mWA).

3. The system according to claim 1, further comprising a second antenna sensor disposed on a second side of the substrate opposite the first side of the substrate,
   the first antenna sensor being configured to operate as a transmitter,
   the second antenna sensor being configured to operate as a receiver, and the first antenna being configured to generate the dataset of S-parameter data together with the second antenna.

4. The system according to claim 3, the first antenna sensor being an mWA, and
the second antenna sensor being an mWA.

5. The system according to claim 1, further comprising at least one defect monitoring structure formed on the substrate.

6. The system according to claim 5, the at least one defect monitoring structure comprising a ring resonator with multiple resonance-using grooves.

7. The system according to claim 3, the first antenna sensor and the second antenna sensor each having a dual patch topology, a patch topology, a horn topology, a spiral topology, or a Yagi topology.

8. The system according to claim 3, the first antenna sensor comprising a first antenna array, and the second antenna sensor comprising a second antenna array.

9. The system according to claim 1, the substrate comprising at least one via structure and at least one pad structure.

10. The system according to claim 3, the first antenna sensor being coupled with a first lens configured to reduce a first aperture and narrow a first bandwidth, and
the second antenna sensor being coupled with a second lens configured to reduce a second aperture and narrow a second bandwidth.

11. The system according to claim 10, the first lens being a Fresnel lens or a curved lens, and
the second lens being a Fresnel lens or a curved lens.

12. The system according to claim 1, the analyzing of the dataset to identify a defect in the substrate comprising using a machine learning model to analyze the dataset, and
the machine learning model being trained using the reference data.

13. The system according to claim 1, the defect comprising at least one of a line discontinuity, a line width change, a die pad shift, a radio frequency (RF) circuit pattern shift, an interconnect pad shift, and a via-pad shift of at least 5 microns.

14. The system according to claim 1, the first antenna having first grooves configured for multiple resonances, and
the second antenna having second grooves configured for multiple resonances.

15. A method for inline monitoring of a manufacturing process, the method comprising:
providing the system according to claim 1;
using the first antenna sensor and the second antenna sensor to generate the dataset of S-parameter data from the substrate;
transmitting the dataset from the first antenna sensor and the second antenna sensor to the machine-readable medium;
analyzing the dataset to identify the defect in the substrate by comparing the dataset to reference data; and
providing process corrections to the user of the system to address the identified defect in the substrate.

16. The method according to claim 15, further comprising implementing the process corrections to address the identified defect in the substrate.

17. The method according to claim 16, the process corrections comprising at least one of: adding printed metal or dielectric material; and trimming metal or a dielectric pattern with a laser.

18. A system for inline monitoring of a manufacturing process, the system comprising:
a first antenna sensor disposed on a first side of a substrate of an electronic device being manufactured during the manufacturing process, the first antenna sensor being configured to operate as a transmitter;
a second antenna sensor disposed on a second side of the substrate opposite the first side of the substrate, the second antenna sensor being configured to operate as a receiver;
at least one defect monitoring structure formed on the substrate;
a processor; and
a machine-readable medium in operable communication with the processor,
the first antenna and the second antenna being configured to generate a dataset of S-parameter data from the substrate and to transmit the dataset to the machine-readable medium,
the machine-readable medium having instructions stored thereon that, when executed by the processor, perform the following steps:
receive the dataset from the first antenna and the second antenna;
analyze the dataset to identify a defect in the substrate by comparing the dataset to reference data; and
provide process corrections to a user of the system to address the identified defect in the substrate,
the first antenna sensor being a millimeter (mm) wave (mmWave) antenna (mWA),
the second antenna sensor being an mWA,
the at least one defect monitoring structure comprising a ring resonator with multiple resonance-using grooves,
the first antenna sensor and the second antenna sensor each having a dual patch topology, a patch topology, a horn topology, a spiral topology, or a Yagi topology,
the substrate comprising at least one via structure and at least one pad structure,
the analyzing of the dataset to identify a defect in the substrate comprising using a machine learning model to analyze the dataset,
the machine learning model being trained using the reference data,
the defect comprising at least one of a line discontinuity, a line width change, and a via-pad shift of at least 5 microns,
the first antenna having first grooves configured for multiple resonances, and
the second antenna having second grooves configured for multiple resonances.

19. A method for inline monitoring of a manufacturing process, the method comprising:
providing the system according to claim 18;
using the first antenna sensor and the second antenna sensor to generate the dataset of S-parameter data from the substrate;
transmitting the dataset from the first antenna sensor and the second antenna sensor to the machine-readable medium;
analyzing the dataset to identify the defect in the substrate by comparing the dataset to reference data;
providing process corrections to the user of the system to address the identified defect in the substrate; and
implementing the process corrections to address the identified defect in the substrate.

20. The method according to claim 19, the process corrections comprising at least one of: adding printed metal or dielectric material; and trimming metal or a dielectric pattern with a laser.

* * * * *